United States Patent [19]
Krasner

[11] Patent Number: 5,841,396
[45] Date of Patent: Nov. 24, 1998

[54] GPS RECEIVER UTILIZING A COMMUNICATION LINK

[75] Inventor: Norman F. Krasner, San Carlos, Calif.

[73] Assignee: SnapTrack, Inc., San Jose, Calif.

[21] Appl. No.: 759,523

[22] Filed: Dec. 4, 1996

Related U.S. Application Data

[63] Continuation-in-part of Ser. No. 612,582, Mar. 8, 1996.

[51] Int. Cl.$^6$ .............................. H04B 7/185; G01S 5/02
[52] U.S. Cl. ........................................... 342/357; 701/213
[58] Field of Search ........................ 342/357; 364/449.7, 364/449.9, 449.95; 701/213, 214

[56] References Cited

U.S. PATENT DOCUMENTS

| | | | |
|---|---|---|---|
| 4,445,118 | 4/1984 | Taylor et al. ............................ | 343/357 |
| 4,457,006 | 6/1984 | Maine ....................................... | 375/87 |
| 4,601,005 | 7/1986 | Kilvington .............................. | 364/602 |
| 4,701,934 | 10/1987 | Jasper ...................................... | 375/1 |
| 4,785,463 | 11/1988 | Jane et al. ................................. | 375/1 |
| 4,797,677 | 1/1989 | MacDoran et al. ...................... | 342/352 |
| 4,959,656 | 9/1990 | Kumar ..................................... | 342/418 |
| 4,998,111 | 3/1991 | Ma et al. .................................. | 342/352 |
| 5,043,736 | 8/1991 | Darnell et al. ........................... | 342/357 |
| 5,119,102 | 6/1992 | Barnard .................................... | 342/357 |
| 5,153,598 | 10/1992 | Alves, Jr. .................................. | 342/352 |
| 5,202,829 | 4/1993 | Geier ........................................ | 364/449 |
| 5,223,844 | 6/1993 | Mansell et al. ........................... | 342/357 |
| 5,225,842 | 7/1993 | Brown et al. ............................. | 342/357 |
| 5,245,634 | 9/1993 | Averbuch ................................. | 375/108 |
| 5,271,034 | 12/1993 | Abaunza ................................... | 375/1 |
| 5,311,194 | 5/1994 | Brown ..................................... | 342/357 |
| 5,317,323 | 5/1994 | Kennedy et al. ......................... | 342/457 |
| 5,323,163 | 6/1994 | Maki ........................................ | 342/357 |
| 5,323,322 | 6/1994 | Mueller et al. ........................... | 364/449 |
| 5,365,450 | 11/1994 | Schuchman et al. .................... | 364/449 |
| 5,379,047 | 1/1995 | Yokev et al. ............................. | 342/457 |
| 5,379,224 | 1/1995 | Brown et al. ............................. | 364/449 |
| 5,379,320 | 1/1995 | Fernandes et al. ........................ | 375/1 |
| 5,416,797 | 5/1995 | Gilhousen et al. ...................... | 375/705 |
| 5,420,592 | 5/1995 | Johnson .................................. | 342/357 |
| 5,430,759 | 7/1995 | Yokev et al. ............................. | 375/202 |
| 5,448,773 | 9/1995 | McBurney et al. ...................... | 455/343 |
| 5,483,549 | 1/1996 | Weinberg et al. ........................ | 375/200 |
| 5,491,486 | 2/1996 | Welles, II et al. ....................... | 342/357 |

FOREIGN PATENT DOCUMENTS

| | | |
|---|---|---|
| 447978A2 | 9/1991 | European Pat. Off. . |
| 545636A1 | 6/1993 | European Pat. Off. . |
| 2273218 | 6/1994 | United Kingdom . |
| WO94283434 | 12/1994 | WIPO . |

OTHER PUBLICATIONS

PCT International Search Report sent Jul. 11, 1997.
Davenport, Robert G. "FFT Processing of Direct Sequence Spreading Codes . . . " IEEE 1991. *National Aerospace and Electronics Conference NAECON* 1991, vol. 1 pp. 98–105, May 1991.
PCT International Search Report sent on Mar. 10, 1997.
PCT International Search Report sent on Feb. 21, 1997.
PCT International Search Report sent on May 13, 1997.

(List continued on next page.)

*Primary Examiner*—Theodore M. Blum
*Attorney, Agent, or Firm*—Blakely, Sokoloff, Taylor & Zafman

[57] ABSTRACT

A precision carrier frequency signal for calibrating a local oscillator of a GPS receiver which is used to acquire GPS signals. The precision carrier frequency signal is used to calibrate the local oscillator such that the output of the local oscillator, which is used to acquire GPS signals, is modified by a reference signal generated from the precision carrier frequency signal. The GPS receiver locks to this precision carrier frequency signal and generates the reference signal. In another aspect of the invention, satellite almanac data is transmitted to a remote GPS receiver unit from a basestation via a communication link. The remote GPS receiver unit uses this satellite almanac data to determine approximate Doppler data for satellites in view of the remote GPS receiver unit.

39 Claims, 14 Drawing Sheets

OTHER PUBLICATIONS

"RTCM Recommended Standards for Differential Navstar GPS Service, Version 2.0" Radio Technical Commission for Maritime Services, Jan. 1, 1990.

"Animal–borne GPS: Tracking the Habitat", Rogers & Anson, GPS World, pp. 21, 22, Jul., 1994.

"Navstar GPS User Equipment, Inttroduction", NATO, Feb. 1991.

"Navigation Journal of the Institute of Navigation, vol. 25, No. 2" The Institute of Navigation, 1978 (entire edition).

"GPS Receiver Structures for the Urban Canyon", Petterson et al., ION–GPS–95, Session C4, Land Vehicular Applications, Palm Springs, CA Sep. 1995.

"An Application of the Global Positioning System to Search and Rescue and Remote Tracking", Raab, et al. Navigation Journal of Institute of Navigation, vol. 24, No. 3, 1977.

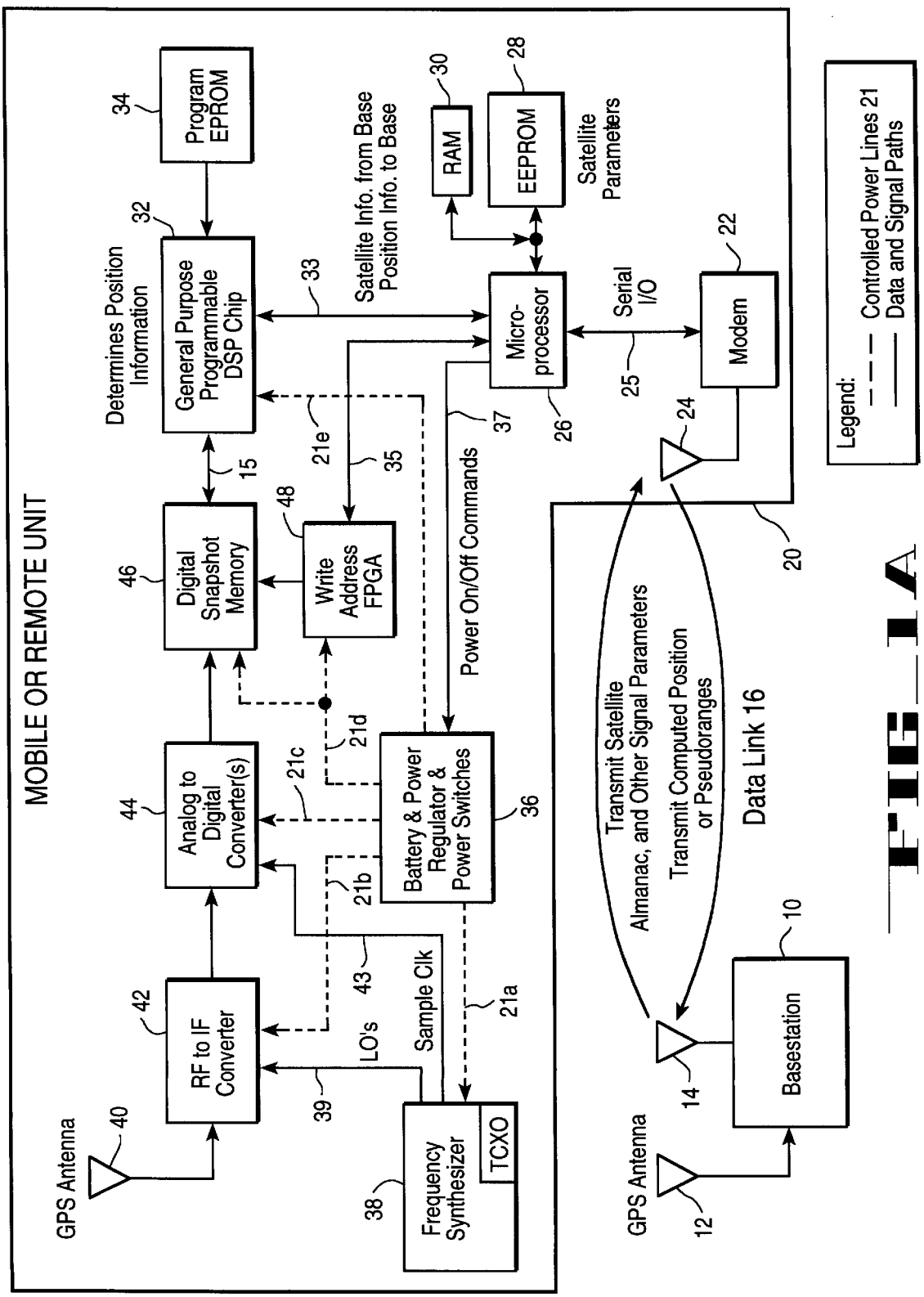

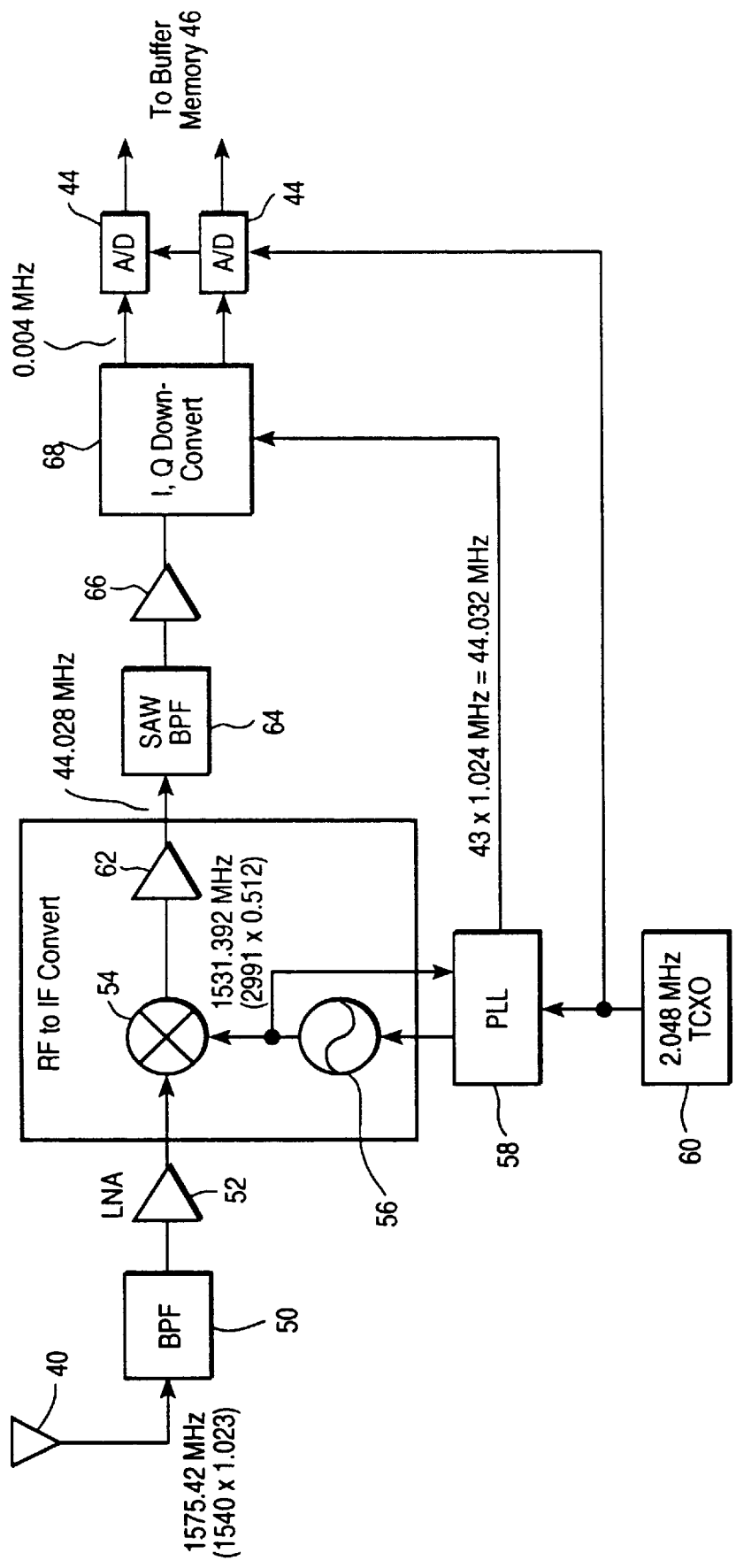
FIG._2A

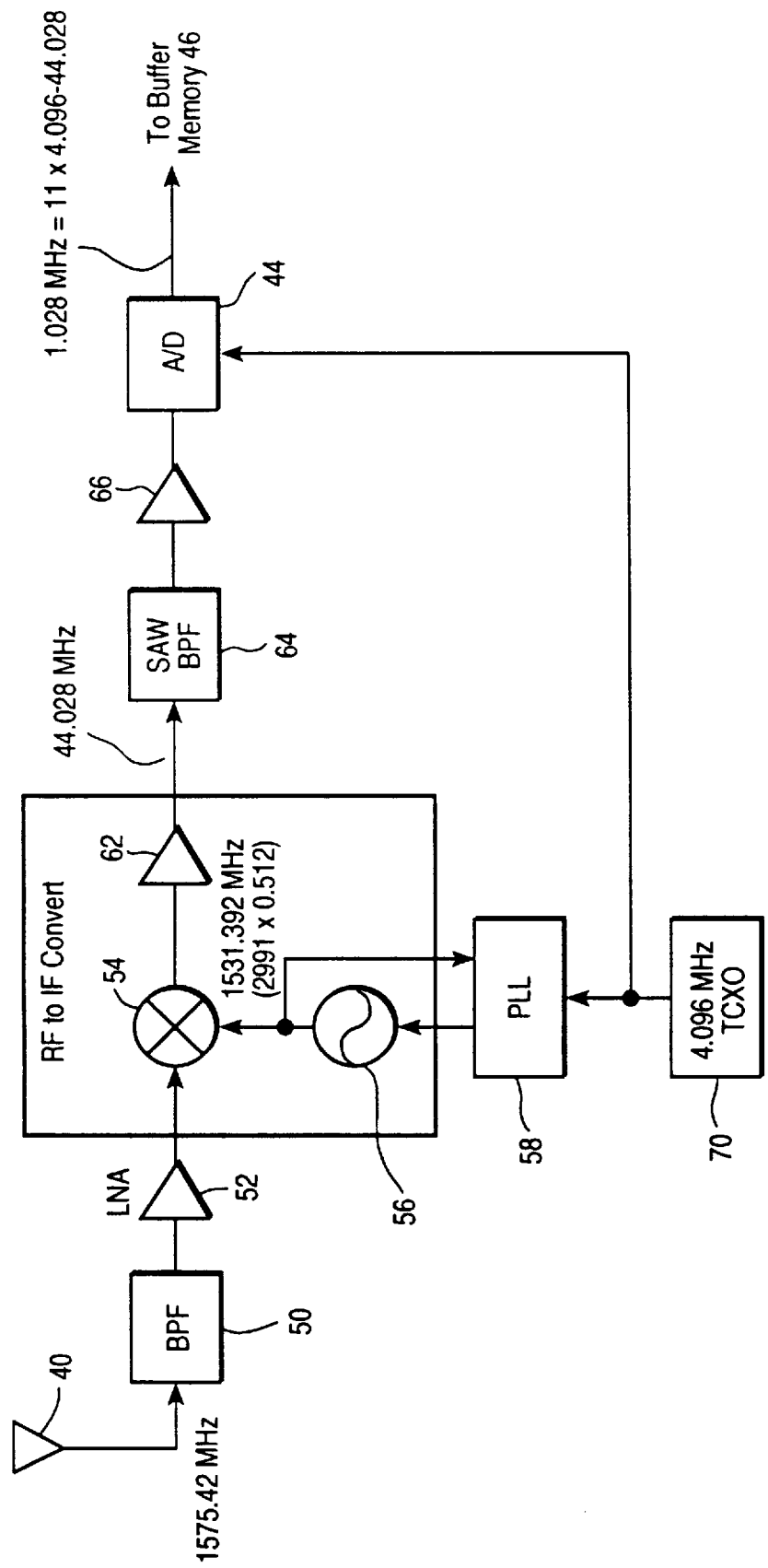
FIG._2B

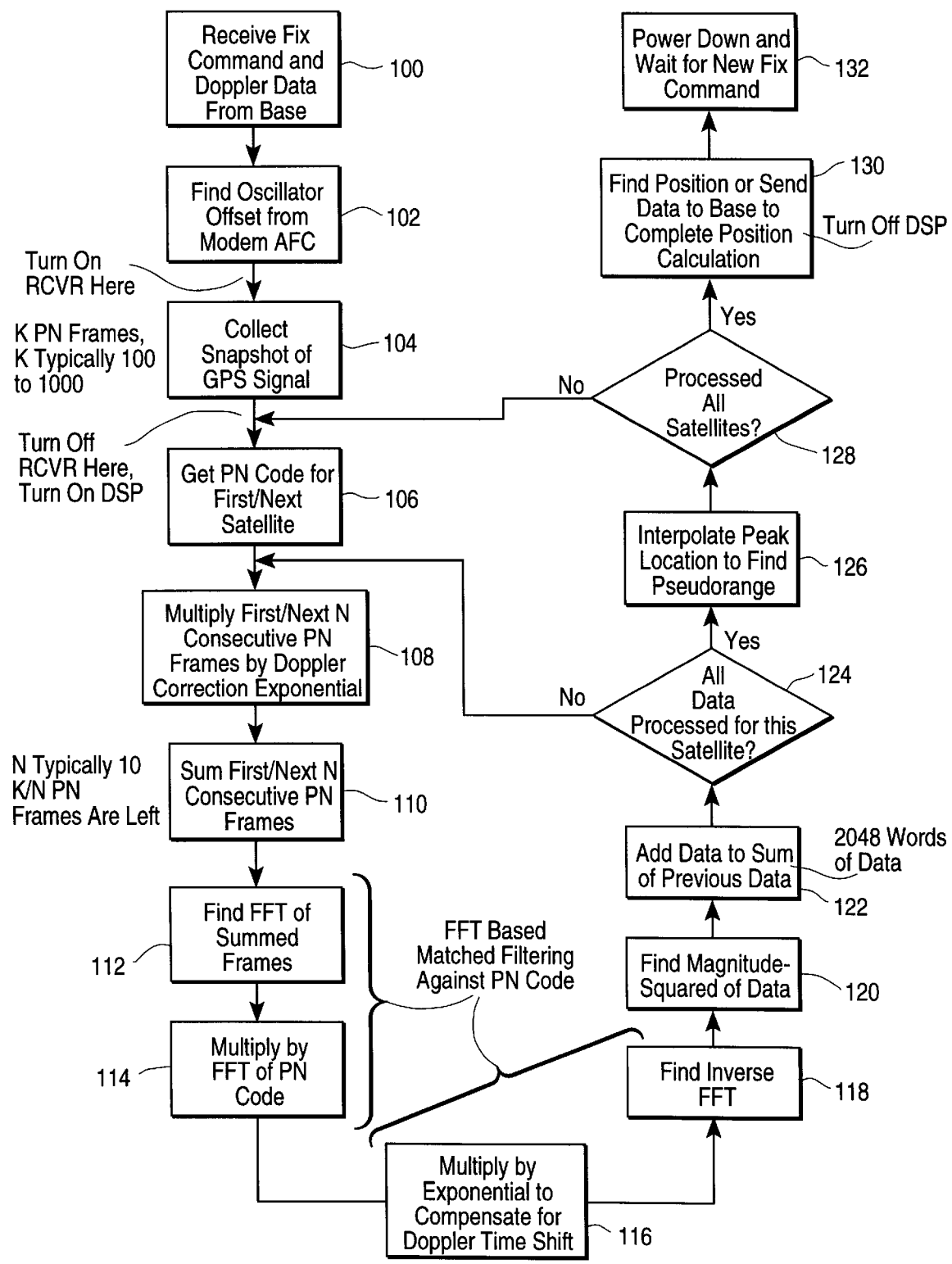
FIG_3

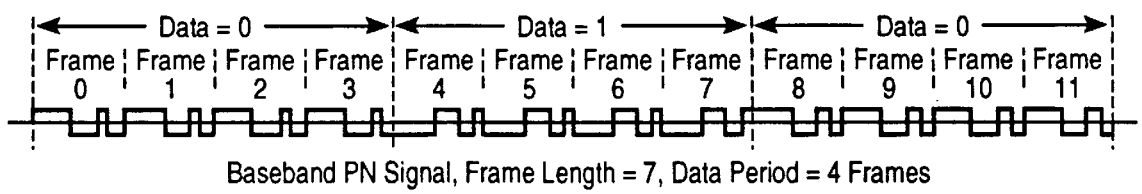
Baseband PN Signal, Frame Length = 7, Data Period = 4 Frames
FIG_4A
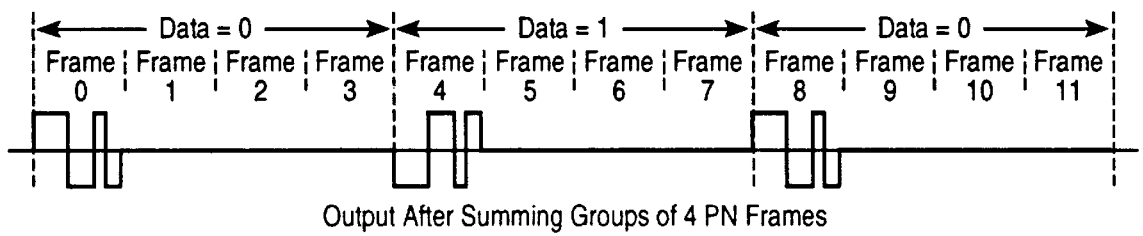
Output After Summing Groups of 4 PN Frames
FIG_4B
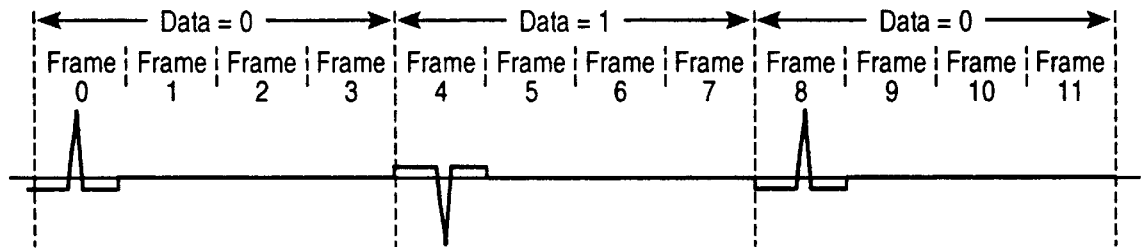
Output After FFT Based Matched Filter
FIG_4C
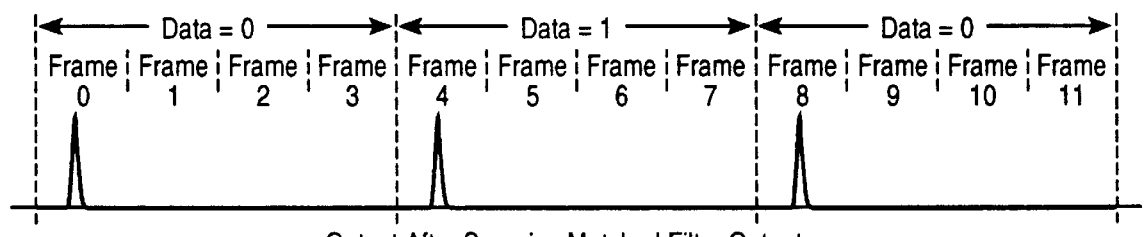
Output After Squaring Matched Filter Outputs
FIG_4D
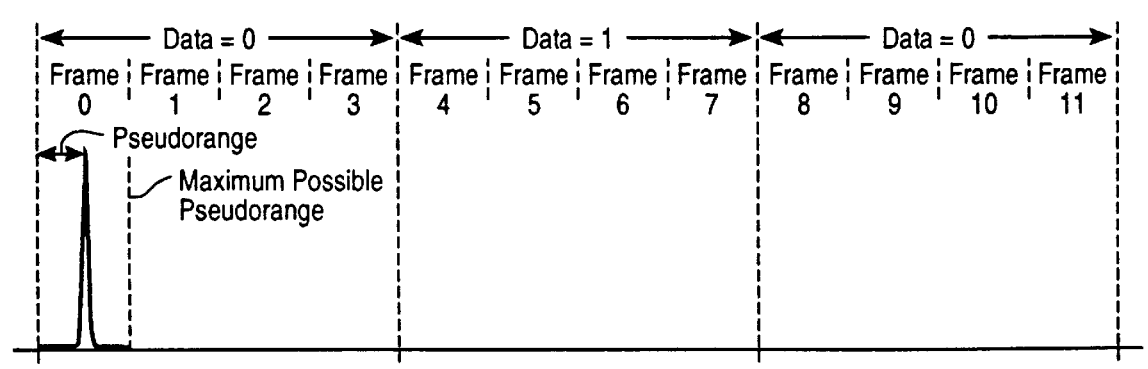
Output After Summing Outputs of D
FIG_4E

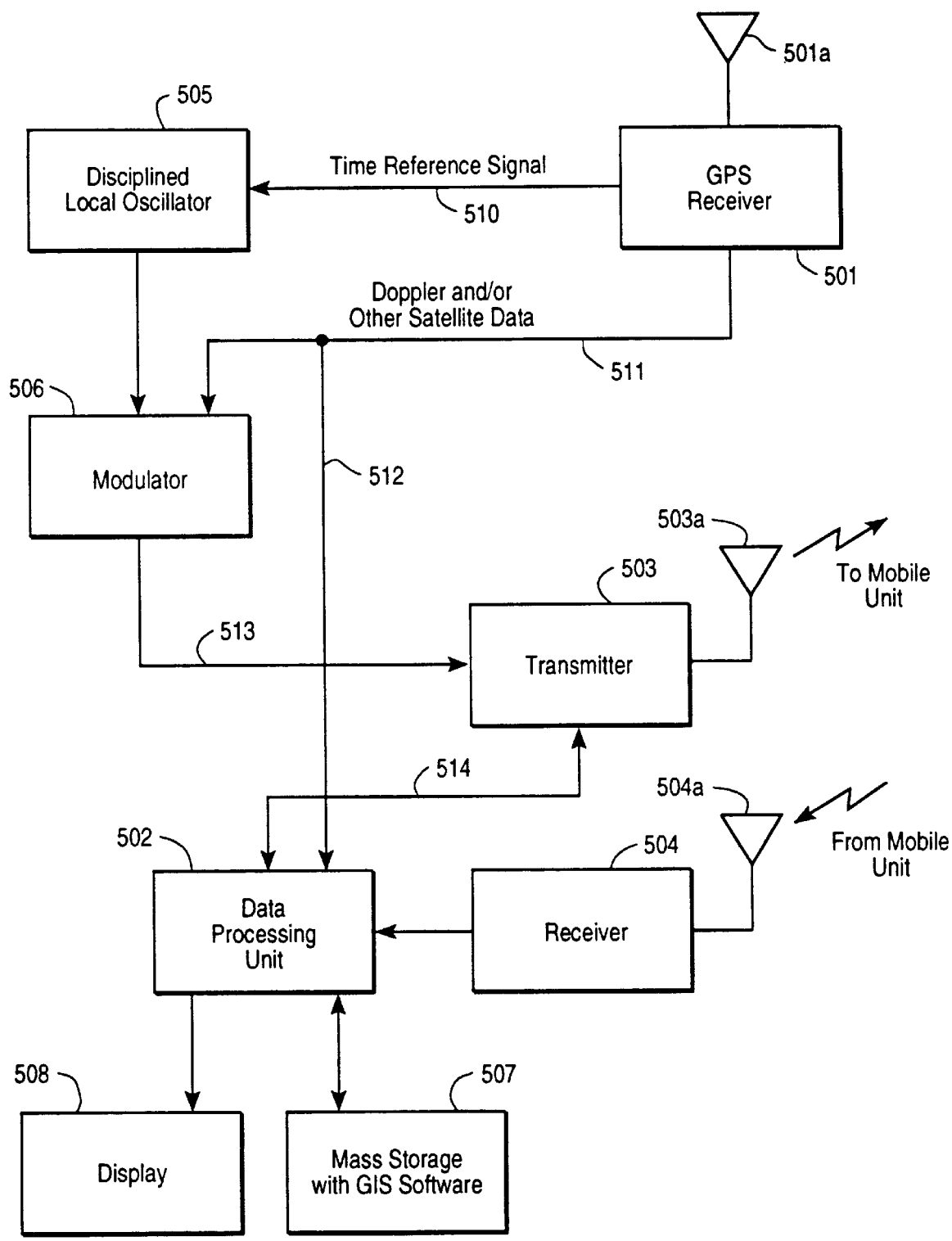
FIG_5A

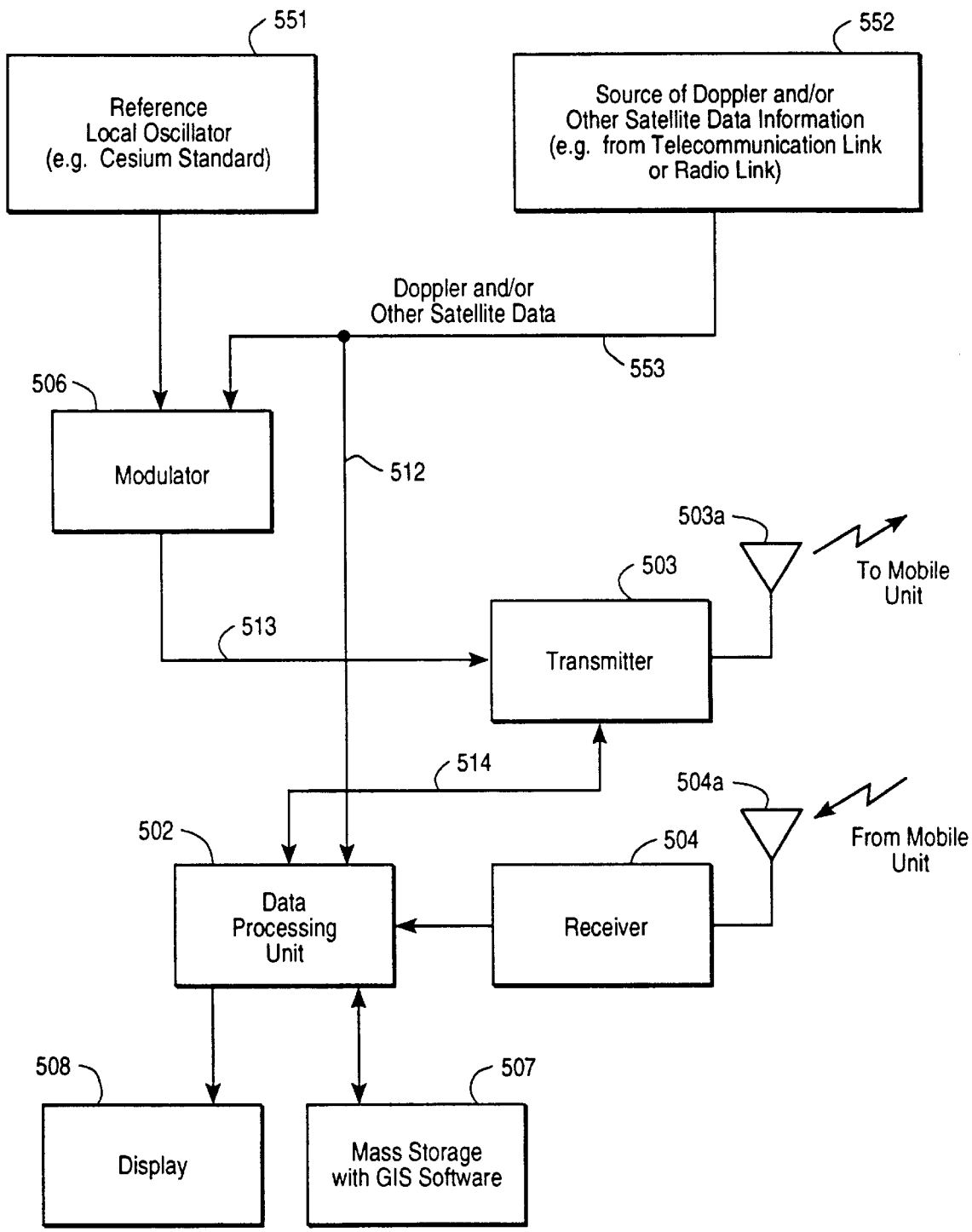
FIG_5B

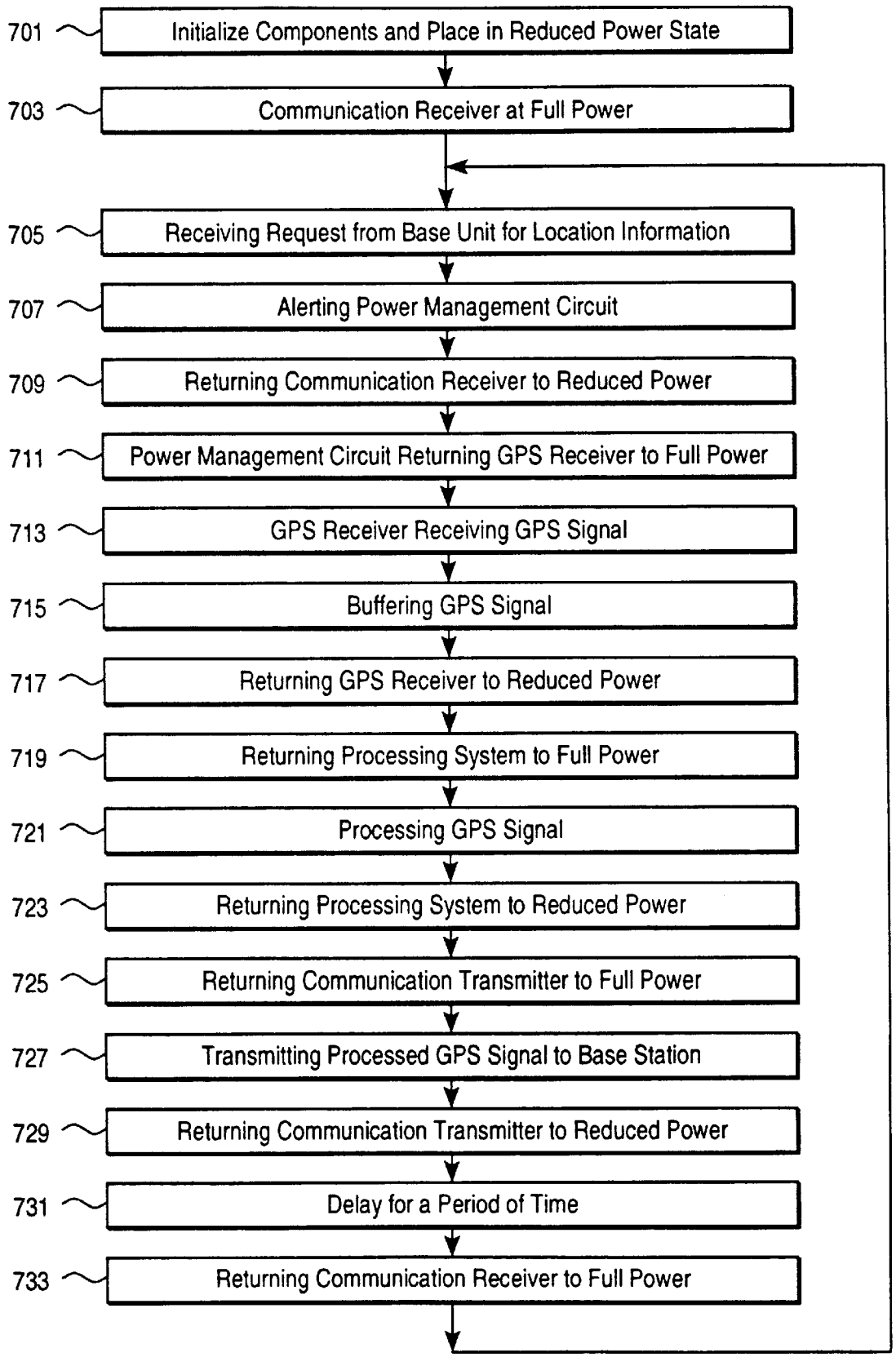

GPS RECEIVER UTILIZING A COMMUNICATION LINK

RELATED APPLICATIONS

This application is a continuation-in-part of U.S. patent application Ser. No. 08/612,582, filed on Mar. 8, 1996 by Norman F. Krasner.

BACKGROUND OF THE INVENTION

This application is also related to and hereby claims the benefit of the filing date of a provisional patent application by the same inventor, Norman F. Krasner, which application is entitled Low Power, Sensitive Pseudorange Measurement Apparatus and Method for Global Positioning Satellites Systems, Ser. No. 60/005,318, filed Oct. 9, 1995.

1. Field of the Invention

The present invention relates to receivers capable of determining position information of satellites and, in particular, relates to such receivers which find application in global positioning satellite (GPS) systems.

2. Background Art

GPS receivers normally determine their position by computing relative times of arrival of signals transmitted simultaneously from a multiplicity of GPS (or NAVSTAR) satellites. These satellites transmit, as part of their message, both satellite positioning data as well as data on clock timing, so-called "ephemeris" data. The process of searching for and acquiring GPS signals, reading the ephemeris data for a multiplicity of satellites and computing the location of the receiver from this data is time consuming, often requiring several minutes. In many cases, this lengthy processing time is unacceptable and, furthermore, greatly limits battery life in micro-miniaturized portable applications.

Another limitation of current GPS receivers is that their operation is limited to situations in which multiple satellites are clearly in view, without obstructions, and where a good quality antenna is properly positioned to receive such signals. As such, they normally are unusable in portable, body mounted applications; in areas where there is significant foliage or building blockage; and in in-building applications.

There are two principal functions of GPS receiving systems: (1) computation of the pseudoranges to the various GPS satellites, and (2) computation of the position of the receiving platform using these pseudoranges and satellite timing and ephemeris data. The pseudoranges are simply the time delays measured between the received signal from each satellite and a local clock. The satellite ephemeris and timing data is extracted from the GPS signal once it is acquired and tracked. As stated above, collecting this information normally takes a relatively long time (30 seconds to several minutes) and must be accomplished with a good received signal level in order to achieve low error rates.

Virtually all known GPS receivers utilize correlation methods to compute pseudoranges. These correlation methods are performed in real time, often with hardware correlators. GPS signals contain high rate repetitive signals called pseudorandom (PN) sequences. The codes available for civilian applications are called C/A codes, and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code.

For a signal received from a given GPS satellite, following a downconversion process to baseband, a correlation receiver multiplies the received signal by a stored replica of the appropriate Gold code contained within its local memory, and then integrates, or lowpass filters, the product in order to obtain an indication of the presence of the signal. This process is termed a "correlation" operation. By sequentially adjusting the relative timing of this stored replica relative to the received signal, and observing the correlation output, the receiver can determine the time delay between the received signal and a local clock. The initial determination of the presence of such an output is termed "acquisition." Once acquisition occurs, the process enters the "tracking" phase in which the timing of the local reference is adjusted in small amounts in order to maintain a high correlation output. The correlation output during the tracking phase may be viewed as the GPS signal with the pseudorandom code removed, or, in common terminology, "despread." This signal is narrow band, with bandwidth commensurate with a 50 bit per second binary phase shift keyed data signal which is superimposed on the GPS waveform.

The correlation acquisition process is very time consuming, especially if received signals are weak. To improve acquisition time, many GPS receivers utilize a multiplicity of correlators (up to 12 typically) which allows a parallel search for correlation peaks.

Another approach to improve acquisition time is described in U.S. Pat. No. 4,445,118. This approach uses the transmission of Doppler information from a control basestation to a remote GPS receiver unit in order to aid in GPS signal acquisition. While this approach does improve acquisition time, the Doppler information is accurate for only a short period of time as the GPS satellites orbit the earth at relatively high speeds. Thus, a further transmission of Doppler information will be necessary in order for a remote unit to use accurate Doppler information.

An approach for improving the accuracy of the position determination by a remote GPS receiver unit is also described in U.S. Pat. No. 4,445,118, referred to as the Taylor patent. In the Taylor patent, a stable frequency reference is transmitted to a remote GPS receiver unit from a basestation in order to eliminate a source of error due to a poor quality local oscillator at the remote GPS receiver unit. This method uses a special frequency shift keyed (FSK) signal that must be situated in frequency very close to the GPS signal frequency. As shown in FIG. 4 of the Taylor patent, the special FSK signal is about 20 MHz below the 1575 MHz GPS signal. Moreover, the approach described in the Taylor patent uses a common mode rejection mechanism in which any error in the local oscillator (shown as L.O. 52) of the receiver will appear in both the GPS channel and the reference channel and hence be canceled out. There is no attempt to detect or measure this error. This approach is sometimes referred to as a homodyne operation. While this approach provides some advantages, it requires that the two channels be closely matched, including closely matched in frequency. Moreover, this approach requires that both frequencies remain fixed, so frequency hopping techniques are not compatible with this approach.

SUMMARY

In one aspect of the present invention, a mobile GPS receiver receives a precision carrier frequency signal from a source providing the precision carrier frequency signal. The receiver locks to this frequency signal and provides a reference signal which is used to calibrate (e.g., stabilize or correct) a local oscillator that is used to acquire GPS signals.

An apparatus which practices this aspect includes, in one embodiment, a first antenna which receives GPS signals and a downconverter coupled to the first antenna. The downconverter is coupled to a local oscillator which provides a first reference signal to the downconverter. The apparatus also includes a second antenna for receiving a precision carrier frequency signal from a source providing the precision carrier frequency signal and an automatic frequency control (AFC) circuit coupled to the second antenna. The AFC circuit provides a second reference signal to the local oscillator to calibrate the first reference signal which is used to acquire GPS signals received through the first antenna. The frequency of the precision carrier frequency signal may vary from transmission to transmission.

One embodiment of the present invention provides a method for determining the position of a remote GPS receiver by transmitting GPS satellite information, including satellite almanac data, to the remote unit or mobile GPS unit from a basestation via a data communication link. The satellite almanac data is then used to determine Doppler data for satellites in view of the remote unit. The remote unit uses this Doppler data and received GPS signals from in view satellites to subsequently compute pseudoranges to the satellites. The computed pseudoranges are then transmitted to the basestation where the position of the remote unit is calculated. Various embodiments of apparatuses which can perform this method are also described.

BRIEF DESCRIPTION OF THE DRAWINGS

The present invention is illustrated by way of example and not limitation in the figures of the accompanying drawings in which references indicate similar elements and in which:

FIG. 1A is a block diagram of the major components of a remote or mobile GPS receiving system utilizing the methods of the present invention, and shows data links that may exist between a basestation and the remote.

FIGS. 2A and 2B provide two alternatives for the RF and IF portions of a receiver which is an embodiment of the present invention.

FIG. 3 shows a flow chart of the major operations (e.g. software operations) performed by the programmable DSP processor in accordance with the methods of the present invention.

FIGS. 4A–4E illustrates the signal processing waveforms at various stages of processing according to the methods of the present invention.

FIG. 5A illustrates a basestation system in one embodiment of the present invention.

FIG. 5B illustrates a basestation system in an alternative embodiment of the present invention.

FIG. 7 is a flow chart which shows a power management method for a mobile unit according to one embodiment of the present invention.

DETAILED DESCRIPTION OF THE INVENTION

Figure 1B:
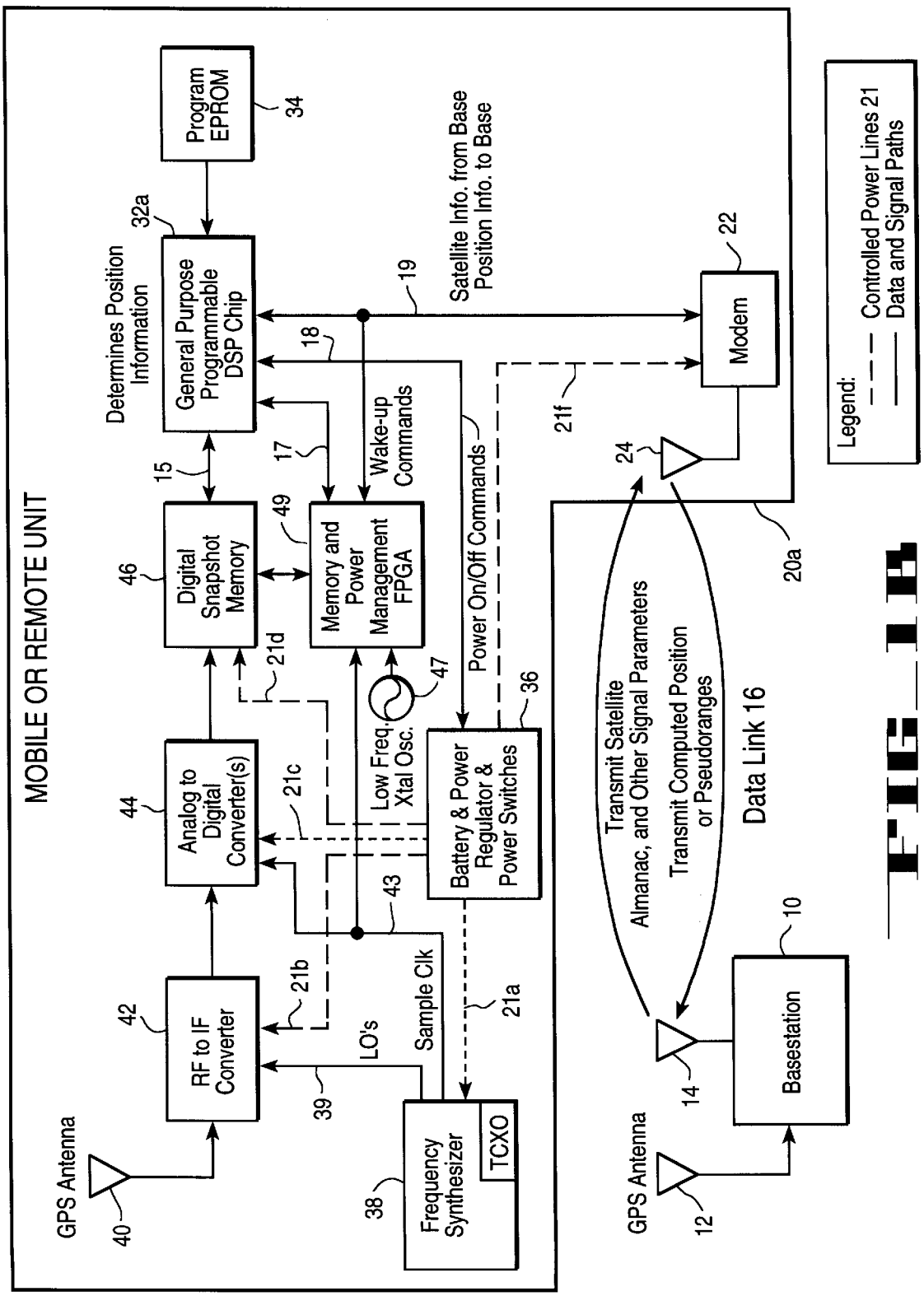
FIG. 1B is a block diagram of an alternative GPS mobile unit.

This invention concerns apparatuses and methods for computing the position of a mobile, or remote, object in a manner that results in the remote hardware having very low power dissipation and the ability to operate with very low received signal levels and yet provide accurate measurements of position information. That is, power consumption is reduced while receiver sensitivity and accuracy is increased. This is also made possible by the receipt and use at the remote unit of a stable frequency communication signal. This is made possible by the implementation of the remote receiving functions, as shown in FIG. 1A, as well as the transmission of satellite almanac information from a separately located basestation 10 to the remote or GPS mobile unit 20.

It should be noted that pseudoranges may be used to compute the remote's geographical position in many different ways. Three examples are:

1. Method 1: By re-transmitting the satellite data messages to the remote 20 from the basestation 10, the remote 20 may combine this information with the pseudorange measurements to compute its position. See, for example, U.S. Pat. No. 5,365,450, which is incorporated herein by reference. Typically, the remote unit 20 performs the computation of position in the remote 20.
2. Method 2: The remote 20 may gather the satellite ephemeris data from the reception of GPS signals in the normal manner that is commonly practiced in the art. This data, which typically is valid for one to two hours, may be combined with pseudorange measurements to complete, typically in the remote unit, the position calculation.
3. Method 3: The remote 20 may transmit over a communications link 16 the pseudoranges to the basestation 10 which can combine this information with the satellite ephemeris data to complete the position calculation. See, for example, U.S. Pat. No. 5,225,842, which is incorporated herein by reference.

In approaches (or Methods) 1 and 3, it is assumed that the basestation 10 and remote 20 have a common view of all satellites of interest and are positioned close enough to one another to resolve a time ambiguity associated with the repetition rate of the GPS pseudorandom codes. This will be met for a range between basestation 10 and remote 20 of ½ times the speed of light times the PN repetition period (1 millisecond), or about 150 km.

In order to explain the current invention, it is assumed that method 3 is utilized to complete the position calculation. However, upon review of this Specification, it will be appreciated by those skilled in the art that the various aspects and embodiments of the present invention could be used with any of the above three Methods as well as other approaches. For example, in a variation of Method 1, satellite data information such as data representative of satellite ephemeris may be transmitted by a basestation to a remote unit, and this satellite data information may be combined with pseudo ranges, computed according to the present invention from buffered GPS signals, to provide a latitude and longitude (and in many cases also an altitude) for the remote unit. It will be appreciated that the position information received from the remote may be limited to latitude and longitude or may be extensive information which includes latitude, longitude, altitude, velocity and bearing of the remote. Moreover, the local oscillator correction and/or the power management aspects of the present invention may be utilized in this variation of Method 1. Furthermore, satellite almanac information may be transmitted to the remote unit 20 and utilized by the remote unit 20 in accordance with aspects of the present invention.

Under Method 3, the basestation 10 commands the remote 20 to perform a measurement via a message transmitted over a data communications link 16 as shown in FIG. 1A. The message from the basestation 10 which commands the remote 20 may typically also specify an identification of the particular satellites in view or other initialization data. The basestation 10 may also send within this message (or may have previously sent) satellite almanac information, which is a form of satellite data information. This satellite almanac information typically includes a description of the approximate position versus time of all satellites in the GPS constellation. U.S. Pat. No. 4,445,118 describes some of the data which may be included in satellite almanac data. This message is received by a separate modem 22 that is part of the remote unit 20, and it is stored in a memory 30 coupled to a low-power microprocessor 26. The satellite almanac information may then be used to derive Doppler information for satellites in view; this derivation is described further below. The almanac data may be valid for periods up to one month. The microprocessor 26 handles data information transfer between the remote unit processing elements 32–48 and the modem 22, and it controls power management functions within the remote receiver 20, as will be evident in the subsequent discussion. Normally, the microprocessor 26 sets most or all remote unit 20's hardware to a low power, or power down, state, except when the pseudorange and/or other GPS calculations are being performed, or when an alternative source of power is available. However, the receiver portion of the modem is at least periodically turned on (to full power) to determine if the basestation 10 has sent a command to the remote to determine the remote's position.

The use of this satellite almanac information to derive Doppler information for satellites in view of the remote eliminates the requirement for the remote 20 to search for such Doppler, thereby reducing its processing time by in excess of a factor of 10. The use of the Doppler information also allows the GPS mobile unit 20 to process more quickly a sample of GPS signals and this tends to reduce the amount of time for which the processor 32 must receive full power in order to compute a position information. This alone reduces the power consumed by the remote unit 20 and contributes to improved sensitivity. Additional information may also be sent to the remote 20, including the epochs of the data in the GPS message.

The received data link signal may utilize a precision carrier frequency. The remote receiver 20 may employ, as shown in FIG. 6 which is described below, an automatic frequency control (AFC) loop to lock to this carrier and thereby further calibrate its own reference oscillator (e.g., by correcting the output frequency of the GPS L.O. which is used to acquire GPS signals). A message transmission time of 10 msec, with a received signal to noise ratio of 20 dB, will normally allow frequency measurement via an AFC to an accuracy of 10 Hz or better. This will typically be more than adequate for the requirements of the present invention. This feature will also enhance the accuracy of the position calculations which are performed, either conventionally or using the fast convolution methods of the present invention. This feature is described below in further detail.

In one embodiment of the invention, the communication link 16 is a commercially available narrow bandwidth radio frequency communication medium, such as a two-way pager system. This system may be used in embodiments where the amount of data transmitted between the remote 20 and basestation 10 is relatively small. The amount of data required for the transmission of Doppler (instead of satellite almanac data) and other data (e.g. initialization data such as the identities of the satellites in view) is relatively small and similarly the amount of data required for the position information (e.g.. pseudoranges) is relatively small. Consequently, narrowband systems are adequate for this embodiment. Satellite almanac data may be compressed such that the amount of data necessary to describe the approximate position of all satellites in the GPS constellation may be transmitted efficiently in a narrowband width communication system. Those systems which require the transmission of large amounts of data over a short period of time may require a higher bandwidth radio frequency communication medium. These higher bandwidth systems may be required in those embodiments where uncompressed satellite almanac data is transmitted.

It will be appreciated that it may nevertheless be efficient to use a narrowband system even when uncompressed satellite almanac information is transmitted because the almanac information has good accuracy for long periods of time (e.g., a month, typically). Thus, this information may be transmitted once a month and then stored in the GPS mobile unit (e.g., in flash EEPROM memory) and used for the entire month; typically, in this case, this information is stored with a time stamp which indicates the date of receipt of the satellite almanac data. The remote unit may then, when receiving a command to provide its position information, determine whether the satellite almanac data is stale and receive or not receive the transmission of almanac data provided by the basestation. If the data is not stale (e.g. the almanac data, as indicated by its time stamp, is less than a month old or some other predetermined period of time), then the data may be used from storage and receipt of "fresh" satellite almanac data is not necessary and the automatic transmission of such data is ignored. Alternatively, the basestation may determine whether to transmit satellite almanac data by keeping a list of the remote units which have been sent satellite almanac data and a time stamp indicating the last transmission of satellite almanac data for each such remote unit. The basestation can then determine whether to transmit satellite almanac data with a position fix command based upon the staleness of the last satellite almanac data stored at the particular remote. If the almanac data at the particular remote is not stale (e.g., it is less than one month old) then the position fix command without the almanac data is transmitted from the basestation to the remote. If the almanac data is stale, then current satellite almanac data is transmitted to the remote unit.

Once the remote 20 receives a command (e.g., from the basestation 10) for GPS processing together with the satellite almanac information (or determines it may use a locally stored version of satellite almanac data), the microprocessor 26 activates the RF to IF Converter 42, Analog to Digital Converter 44 and Digital Snapshot Memory 46 via a Battery and Power Regulator and Power Switches circuit 36 (and controlled power lines 21a, 21b, 21c and 21d) thereby providing full power to these components. This causes the signal from the GPS satellite which is received via antenna 40 to be downconverted to an IF frequency, where it subsequently undergoes digitization. A set of such data, typically corresponding to a duration of 100 milliseconds to 1 second (or even longer), is then stored in a Snapshot Memory 46. The amount of data stored may be controlled by the microprocessor 26 such that more data may be stored in the memory 46 (to obtain better sensitivity) in those situations when conserving power is not as important as obtaining better sensitivity, and less data may be stored in those situations when conservation of power is more important than sensitivity. Typically, sensitivity is more important when the GPS signals may be obstructed partially, and power conservation is less important when a copious power supply (e.g. a car battery) is available. The addressing of this memory 46 to store this data is controlled by a Field Programmable Gate Array integrated circuit 48. Downconversion of the GPS signal is accomplished using a frequency synthesizer 38 which provides local oscillator signal 39 to the converter 42 as discussed further below.

Note that all this time (while the snapshot memory 46 is being filled with the digitized GPS signals from the in view satellites) the DSP microprocessor 32 may be kept in a low power state. The RF to IF Converter 42 and Analog to Digital Converter 44 are typically only turned on for a short period of time, sufficient to collect and store the data required for pseudorange calculation. After the data collection is complete, these converter circuits are turned off or power is otherwise reduced via controlled power lines 21b and 21c (while the memory 46 continues to receive full power), thus not contributing to additional power dissipation during the actual pseudorange calculation. The pseudorange calculation is then performed using, in one embodiment, a general purpose, programmable digital signal processing IC 32 (DSP), as exemplified by a TMS320C30 integrated circuit from Texas Instruments. This DSP 32 is placed in an active power state by the microprocessor 26 and the circuit 36 via controlled power line 21e prior to performing such calculations.

This DSP 32 differs from others used in some remote GPS units in that it is general purpose and programmable, as compared to specialized custom digital signal processing IC's. Furthermore, the DSP 32 makes possible the use of a Fast Fourier Transform (FFT) algorithm, which permits very rapid computation of the pseudoranges by performing rapidly a large number of correlation operations between a locally generated reference and the received signals. Typically, 2046 such correlations are required to complete the search for the epochs of each received GPS signal. The Fast Fourier Transform algorithm permits a simultaneous and parallel search of all such positions, thus speeding the required computation process by a factor of 10 to 100 over conventional approaches.

Once the DSP 32 completes its computation of pseudoranges for each of the in view satellites, it transmits, in one embodiment of the invention, this information to the microprocessor 26 via interconnect bus 33. At this time the microprocessor 26 may cause the DSP 32 and memory 46 to again enter a low power state by sending an appropriate control signal to the Battery and Power Regulator circuit 36. Then, the microprocessor 26 utilizes a modem 22 to transmit the pseudorange data over a data link 16 to the basestation 10 for final position computation. In addition to the pseudorange data, a time tag may simultaneously be transmitted to the basestation 10 that indicates the elapsed time from the initial data collection in the buffer 46 to the time of transmission of the data over the data link 16. This time tag improves the capability of the basestation to compute position calculation, since it allows the computation of the GPS satellite positions at the time of data collection. As an alternative, in accordance with Method 1 above, the DSP 32 may compute the position (e.g. latitude, longitude or latitude, longitude and altitude) of the remote unit and send this data to the microprocessor 26, which similarly relays this data to the basestation 10 via the modem 22. In this case the position computation is eased by the DSP maintaining the elapsed time from the reception of satellite data messages to the time at which the buffer data collection begins. This improves the capability of the remote unit to compute position calculation, since it allows the computation of the GPS satellite positions at the time of data collection.

As shown in FIG. 1A, modem 22, in one embodiment, utilizes a separate antenna 24 to transmit and receive messages over data link 16. It will be appreciated that the modem 22 includes a communication receiver and a communication transmitter which are alternatively coupled to the antenna 24. Similarly, basestation 10 may use a separate antenna 14 to transmit and receive data link messages, thus allowing continuous reception of GPS signals via GPS antenna 12 at the basestation 10.

It is expected, in a typical example, that the position calculations in the DSP 32 will require less than a few seconds of time, depending upon the amount of data stored in the digital snapshot memory 46 and the speed of the DSP or several DSPs.

It should be clear from the above discussion that the remote unit 20 need only activate its high power consumption circuits for a small fraction of time, if position calculation commands from the basestation 10 are infrequent. It is anticipated, in at least many situations, that such commands will result in the remote equipment being activated to its high power dissipation state only about 1% of the time or less.

This then allows battery operation for 100 times the length of time that would otherwise be possible. The program commands necessary for the performance of the power management operation are stored in EEPROM 28 or other suitable storage media. This power management strategy may be adaptable to different power availability situations. For example, when prime power is available the determination of position may occur on a continuing basis.

As indicated above, the digital snapshot memory 46 captures a record corresponding to a relatively long period of time. The efficient processing of this large block of data using fast convolution methods contributes to the ability of the present invention to process signals at low received levels (e.g., when reception is poor due to partial blockage from buildings, trees, etc.). All pseudoranges for visible GPS satellites are computed using this same buffered data. This provides improved performance relative to continuous tracking GPS receivers in situations (such as urban blockage conditions) in which the signal amplitude is rapidly changing.

A slightly different implementation exhibited in FIG. 1B dispenses with the microprocessor 26 and its peripherals (RAM 30 and EEPROM 28) and replaces its functionality with additional circuitry contained within a more complex FPGA (field programmable gate array) 49. The structure and operation of the remote unit shown in FIG. 1B is described in further detail in U.S. patent application Ser. No. 08/612,669, filed Mar. 8, 1996 by Norman F. Krasner, now U.S. Pat. No. 5,663,734, which application is hereby incorporated herein by reference. The remote unit of FIG. 1B uses the DSP 32a to selectively power on or reduce power to different components according to a power management method such as that shown in FIG. 7.

Figure 1C:
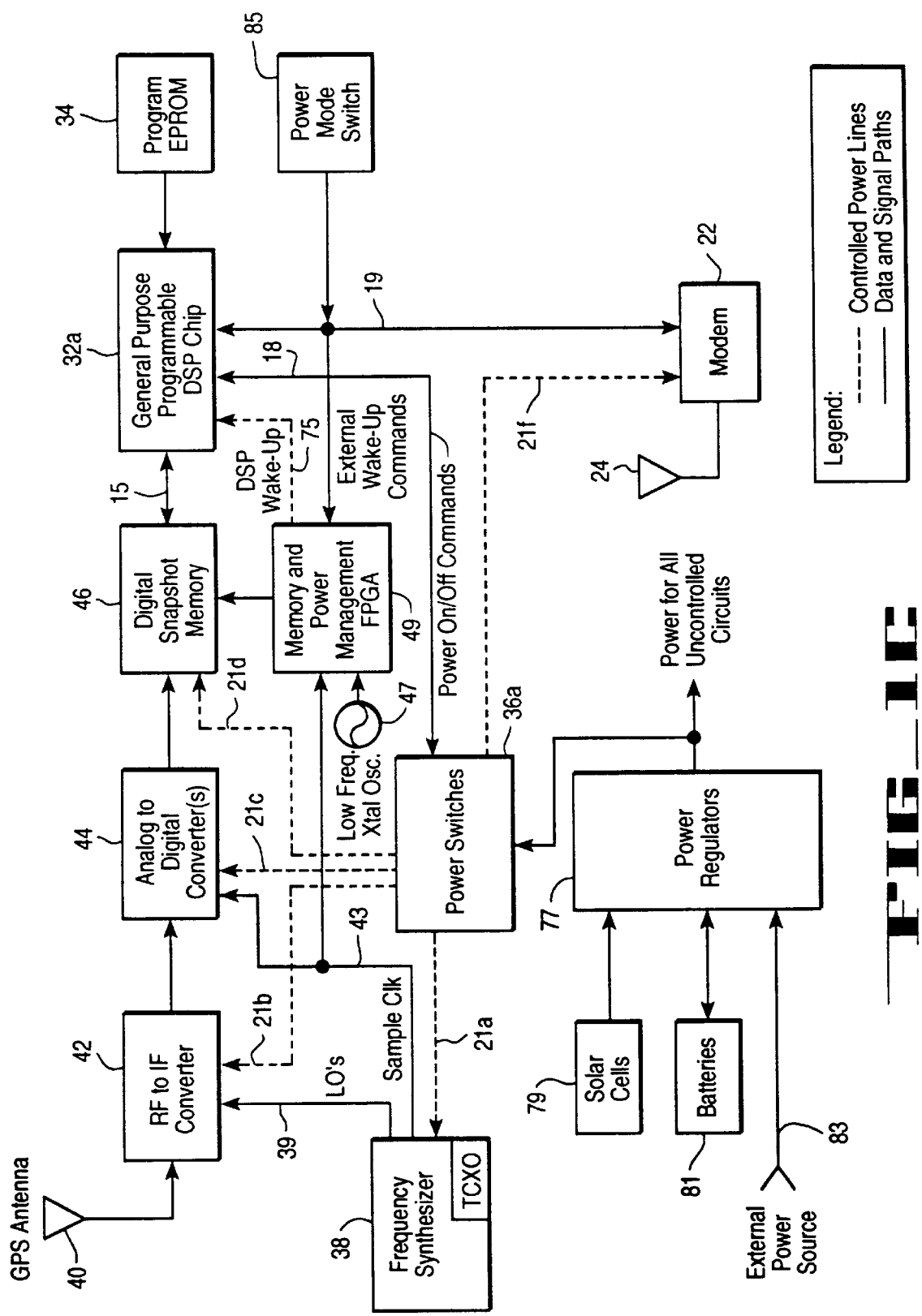
FIG. 1C is a block diagram of another alternative GPS mobile unit.

FIG. 1C shows another embodiment according to the present invention of a GPS mobile unit which contains many of the same components as the GPS mobile units shown in FIGS. 1A and 1B.

FIG. 1C shows a feature of the present invention which allows the GPS mobile unit to trade off sensitivity for power conservation. As described herein sensitivity of the GPS mobile unit may be increased by increasing the amount of buffered GPS signals which are stored in the memory 46. This is done by acquiring and digitizing more GPS signals and storing this data in the memory 46.

While this increased buffering causes more power consumption, it does improve the sensitivity of the GPS mobile unit. The structure and operation of the remote unit shown in FIG. 1C is described in further detail in the above noted U.S. patent application Ser. No. 08/612,669, filed Mar. 8, 1996.

Representative examples of an RF to IF frequency converter and digitizing system for the mobile GPS unit are shown in FIG. 2A and 2B. The structure and operation of these examples shown in FIG. 2A and 2B are described in further detail in the above noted U.S. patent application Ser. No. 08/612,669, filed Mar. 8, 1996.

Details of the GPS signal processing performed in the DSP 32 may be understood with the aid of the flow chart of FIG. 3 and the pictorial of FIGS. 4A, 4B, 4C, 4D and 4E. It will be apparent to those skilled in the art that the machine code, or other suitable code, for performing the signal processing to be described is stored in EPROM 34. Other non-volatile storage devices could also be used. The following assumes that the I/Q sampling of FIG. 2A is employed and that the snapshot memory 46 contains two channels of digitized data at 2.048 MHz. The objective of the processing is to determine the timing of the received waveform with respect to a locally generated waveform. Furthermore, in order to achieve high sensitivity, a very long portion of such a waveform, typically 100 milliseconds to 1 second, is processed. It will also be appreciated that the Doppler information which is used in this signal processing may be Doppler information which was derived from stored or recently transmitted satellite almanac data (or may be Doppler information directly transmitted along with the position command to the remote unit so that no Doppler derivation in the remote unit is required) The derivation of Doppler information from satellite almanac data is described further herein in conjunction with FIG. 8. Further details concerning the signal processing shown in FIGS. 3 and 4A–4E are described in the above noted U.S. patent application Ser. No. 08/612,669, filed Mar. 8, 1996.

A summary of the signal processing described above and shown in FIG. 3 and in FIGS. 4A–4E will now be provided. The GPS signals from one or more in view GPS satellites are received at the remote GPS unit using an antenna on the remote GPS unit. These signals are digitized and stored in a buffer in the remote GPS unit. After storing these signals, a processor performs in one embodiment preprocessing, fast convolution processing, and post processing operations. These processing operations involve:

a) breaking the stored data into a series of blocks whose durations are equal to a multiple of the frame period of the pseudorandom (PN) codes contained within the GPS signals.

b) for each block performing a preprocessing step which creates a compressed block of data with length equal to the duration of a pseudorandom code period by coherently adding together successive subblocks of data, the subblocks having a duration equal to one PN frame; this addition step will mean that the corresponding sample numbers of each of the subblocks are added to one another.

c) for each compressed block, performing a matched filtering operation, which utilizes fast convolution techniques, to determine the relative timing between the received PN code contained within the block of data and a locally generated PN reference signal (e.g. the pseudorandom sequence of the GPS satellite being processed).

d) determining a pseudorange by performing a magnitude-squared operation on the products created from said matched filtering operation and post processing this by combining the magnitude-squared data for all blocks into a single block of data by adding together the blocks of magnitude-squared data to produce a peak.

and e) finding the location of the peak of said single block of data to high precision using digital interpolation methods, where the location is the distance from the beginning of the data block to the said peak, and the location represents a pseudorange to a GPS satellite corresponding to the pseudorandom sequence being processed.

Typically, the fast convolution technique used in processing the buffered GPS signals is a Fast Fourier Transform (FFT) and the result of the convolution is produced by computing the product of the forward transform of the compressed block and a prestored representation of the forward transform of the pseudorandom sequence to produce a first result and then performing an inverse transformation of the first result to recover the result. Also, the effects the Doppler induced time delays and local oscillator induced time errors are compensated for on each compressed block of data by inserting between the forward and inverse Fast Fourier Transform operations, the multiplication of the forward FFT of the compressed blocks by a complex exponential whose phase versus sample number is adjusted to correspond to the delay compensation required for the block.

In the foregoing embodiment the processing of GPS signals from each satellite occurs sequentially over time, rather than in parallel. In an alternative embodiment, the GPS signals from all in view satellites may be processed together in a parallel fashion in time.

It is assumed here that the basestation 10 has a common view of all satellites of interest and that it is sufficiently close in range to remote unit 20 in order to avoid ambiguities associated with the repetition period of the C/A PN code. A range of 90 miles will satisfy this criteria. The basestation 10 is also assumed to have a GPS receiver and a good geographical location such that all satellites in view are continuously tracked to high precision.

While several described embodiments of the basestation 10 show the use of a data processing component, such as a computer at the basestation in order to compute position information such as a latitude and a longitude for the mobile GPS unit, it will be appreciated that each basestation 10 may merely relay the information received, such as pseudoranges from a mobile GPS unit, to a central location or several central locations which actually perform the computation of latitude and longitude. In this manner the cost and complexity of these relaying basestations may be reduced by eliminating a data processing unit and its associated components from each relaying basestation. A central location, would include receivers (e.g. telecommunication receivers) and a data processing unit and associated components. Moreover, in certain embodiments, the basestation may be virtual in that it may be a satellite which transmits Doppler information or satellite almanac data to remote units, thereby emulating a basestation in a transmission cell.

FIGS. 5A and 5B show two embodiments of a basestation according to the present invention. In the basestation shown in FIG. 5A, a GPS receiver 501 receives GPS signals through a GPS antenna 501a. The GPS receiver 501, which may be a conventional GPS receiver, provides a timed reference signal which typically is timed relative to GPS signals and also provides satellite almanac data for all the satellites in the constellation of GPS satellites and may provide Doppler information relative to the satellites in view. This GPS receiver 501 is coupled to a disciplined local oscillator 505 which receives the time reference signal 510 and phase locks itself to this reference. This disciplined local oscillator 505 has an output which is provided to a modulator 506. The modulator 506 also receives the satellite almanac data (or alternatively, Doppler data information signals for each satellite in view of the GPS mobile unit) and/or other satellite data information signals 511. The modulator 506 modulates the satellite almanac data (or alternatively, the Doppler) and/or other satellite data information onto the local oscillator signal received from the discipline local oscillator 505 in order to provide a modulated signal 513 to the transmitter 503. The transmitter 503 is coupled to the data processing unit 502 via interconnect 514 such that the data processing unit may control the operation of the transmitter 503 in order to cause the transmission of satellite data information, such as the satellite almanac information to a GPS mobile unit via the transmitter's antenna 503a. In this manner, a GPS mobile unit may receive the satellite almanac information, the source of which is the GPS receiver 501 and may also receive a high precision local oscillator carrier signal which may be used to calibrate the local oscillator in the GPS mobile unit as shown in FIG. 6. It will be appreciated that the basestation may transmit the current satellite almanac data automatically with each transmission of a position fix command to the remote unit. Alternatively the basestation may, as described above, determine whether the remote's stored version of the satellite almanac data is stale and transmit the current almanac data only if the remote's stored version is stale. If a high bandwidth communication system is being used as the communication link (e.g., a cellular telephone system) then the former approach is preferred. If a narrow bandwidth communication system is being used, then the latter approach may be preferred.

The basestation as shown in FIG. 5A also includes a receiver 504 which is coupled to receive communication signals from the remote or GPS mobile unit via a communication antenna 504a. It will be appreciated that the antenna 504a may be the same antenna as the transmitter's antenna 503a such that a single antenna serves both the transmitter and the receiver in the conventional fashion. The receiver 504 is coupled to the data processing unit 502 which may be a conventional computer system. The processing unit 502 may also include an interconnect 512 to receive the Doppler and/or other satellite data information from the GPS receiver 511. This information may be utilized in processing the pseudorange information or other information received from the mobile unit via the receiver 504. This data processing unit 502 is coupled to a display device 508, which may be a conventional CRT. The data processing unit 502 is also coupled to a mass storage device 507 which includes GIS (Geographical Information System) software (e.g. Atlas GIS from Strategic Mapping, Inc. of Santa Clara, Calif.) which is used to display maps on the display 508. Using the display maps, the position of the mobile GPS unit may be indicated on the display relative to a displayed map.

An alternative basestation shown in FIG. 5B includes many of the same components shown in FIG. 5A. However, rather than obtaining the satellite almanac data or Doppler and/or other satellite data information from a GPS receiver, the basestation of FIG. 5B includes a source of satellite almanac data or Doppler and/or other satellite data information 552 which is obtained from a telecommunication link or a radio link in a conventional matter. For example, this information may be obtained from a server site on the Internet. This Doppler and/or satellite information is conveyed over an interconnect 553 to the modulator 506. The other input the modulator 506 shown in FIG. 5B is the oscillator output signal from a reference quality local oscillator such as a cesium standard local oscillator. This reference local oscillator 551 provides a precision carrier frequency onto which is modulated the Doppler and/or other satellite data information which is then transmitted via transmitter 503 to the mobile GPS unit.

Although the preceding discussion illustrates a basestation which integrates all functions of satellite data transmission and frequency reference information, in most practical situations this may be partially performed using commercial telecommunication systems, such as cellular or paging systems. For example, most digital cellular systems utilize a very stable local oscillator in their transmitted signals. In this case, a basestation need only gather the satellite data, as in blocks 501 or 552 and send this data over such a cellular system using a conventional wireline modem. The actual modulation functions, including the precision frequency reference transmission, are then performed by the cell site transmitter. This approach results in a very low cost basestation with no special RF circuitry. Similarly, on the remote to basestation link, the cellular system provides the receiving and demodulation functions of block 504 and the basestation need only utilize a modem to receive such data over normal wirelines.

It is an important characteristic of this invention that the transmission frequency and format of the data signals are unimportant, as long as the carrier frequency is very stable. It should also be noted that this carrier frequency may vary from one transmission to the next, as it commonly does in cellular systems, which utilize a large number of frequency channels to service a large number of users. In some cases the carrier frequency may also vary within one call. For example, frequency hopping is utilized in some digital cellular systems. Again, this invention can utilize such signaling, as long as the remote receiver can frequency lock to the stable transmitted frequencies.

Figure 6A:
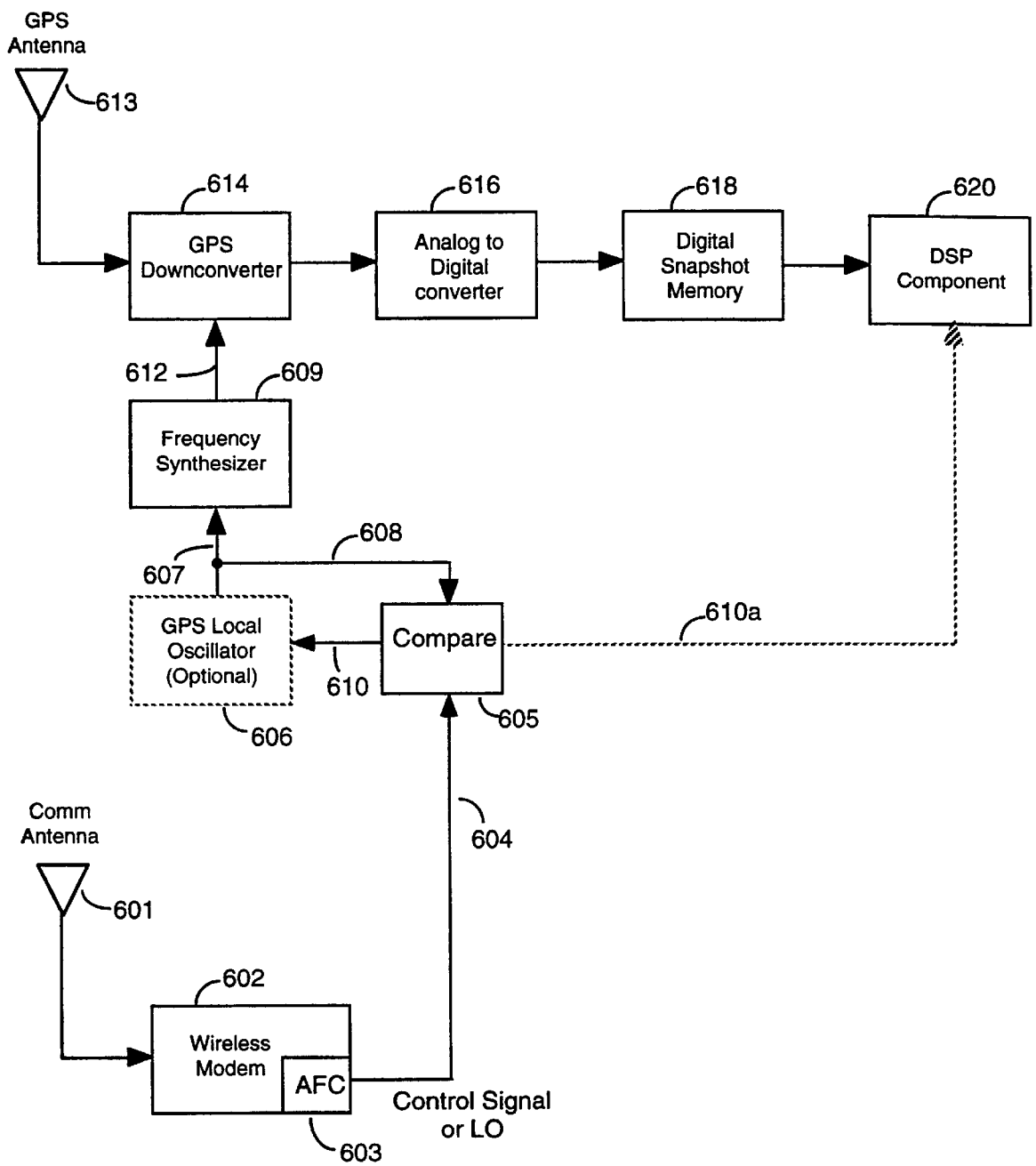
FIG. 6A illustrates a GPS mobile unit having, according to one aspect of the present invention, local oscillator calibration.

FIG. 6A shows an embodiment of a GPS mobile unit of the present invention which utilizes the precision carrier frequency signal received through the communication channel antenna 601 which is similar to the antenna 24 shown in FIG. 1A. The antenna 601 is coupled to the modem 602, which is similar to the modem 22 in FIG. 1A, and this modem 602 is coupled to an automatic frequency control circuit 603 which locks to the precision carrier frequency signal sent by the basestation (which may be considered to be or include a cellular telephone cell site transmitter) described herein according to one embodiment of the present invention. The automatic frequency control circuit 603 provides an output 604, which is typically locked in frequency to the precision carrier frequency.

This signal 604 is compared by the comparator 605 to the output of the GPS local oscillator 606, via interconnect 608. The result of the comparison performed by the comparator 605 is an error correction signal 610 which is provided as a correction signal to the GPS local oscillator 606. In this manner, the frequency synthesizer 609 provides a higher quality, calibrated local oscillation signal over interconnect 612 to the GPS down converter 614. It will be appreciated that the GPS local oscillator 606 and the frequency synthesizer 609 may together be considered a local oscillator which provides a GPS clock signal that is inputted to the downconverter to acquire the GPS signals received through the GPS antenna 613. As used herein, "calibrated", "calibrate" or "calibration" refers to either a system which measures and corrects a local oscillator (by using a reference signal derived from a measurement of an error in a local oscillator) or a system which stabilizes a local oscillator signal (e.g., by feeding a local oscillator signal from the communication receiver to frequency synthesizing circuits that generate GPS clock signals which are used to downconvert/acquire GPS signals). It will be appreciated that the signal provided over interconnect 612 is similar to the local oscillator signal provided by interconnect 39 on FIG. 1A to the converter 42; also, the converter 42 is similar to the GPS down converter 614 which is coupled to the GPS antenna 613 to receive GPS signals.

In an alternative embodiment the signal 604 provided by the AFC unit in the communication receiver is an LO which at the proper frequency serves as a reference for the frequency synthesizer 609. In this case no GPS local oscillator is required (shown in FIG. 6A as optional for this reason) and this signal 604 will be fed directly to the synthesizer 609 in substitution for the signal 607 from the GPS local oscillator. In this manner, a precise, stable local oscillator clock signal is provided to the GPS downconverter for the downconverter to acquire GPS signals received through a GPS antenna.

In another alternative embodiment, the result of the comparison performed by comparator 605 may be output via interconnect 610a as an error correction to the DSP component 620 which is similar to the DSP chip 32 shown in FIG. 1A. In this instance, no error correction signal 610 will be provided indirectly to the frequency synthesizer 609. The automatic frequency control circuit may be implemented using a number of conventional techniques including a phase lock loop or a frequency lock loop or a block phase estimator.

Figure 6B:
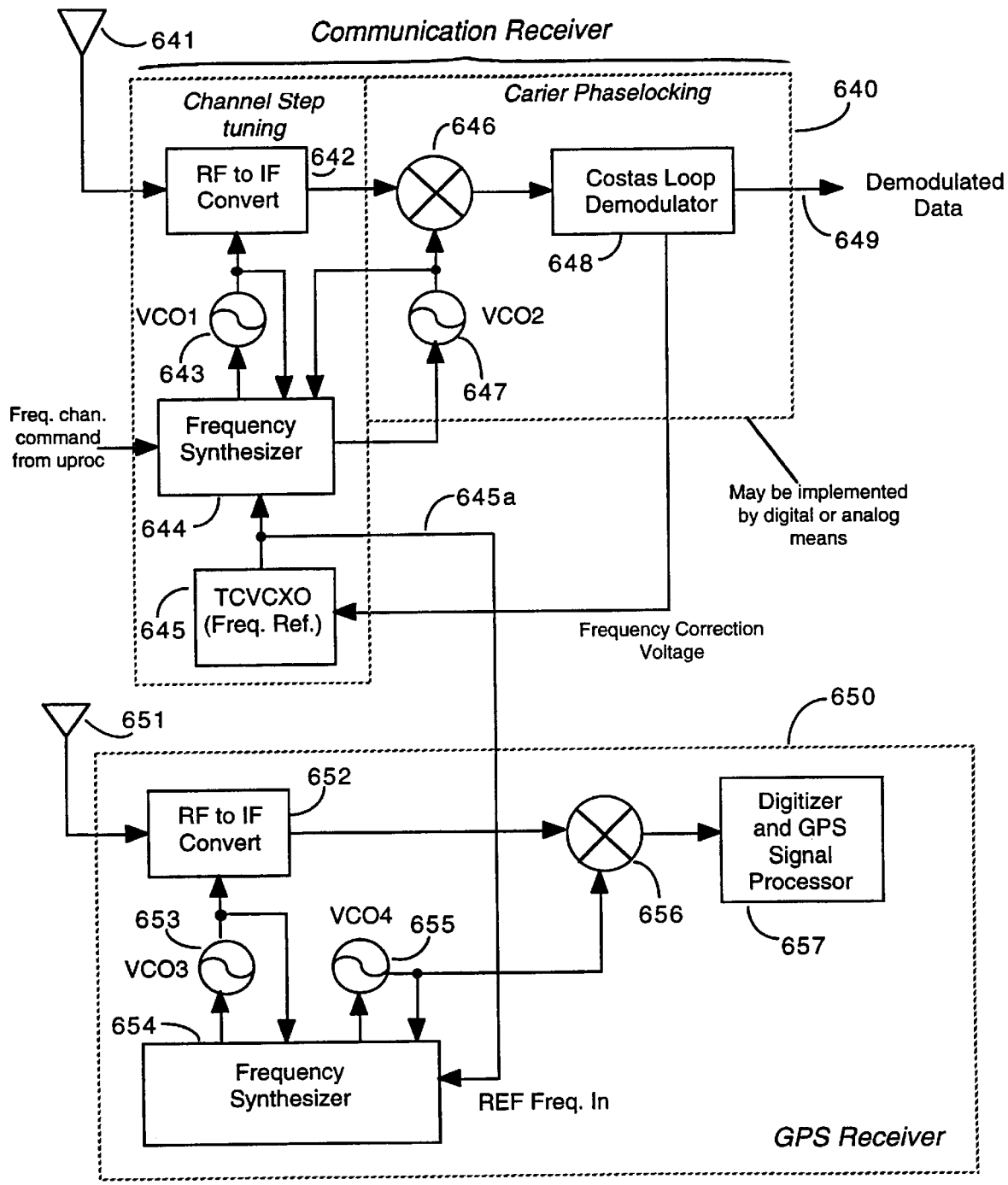
FIGS. 6B and 6C show other embodiments of GPS mobile units having local oscillator calibration.

FIG. 6B shows another embodiment of a mobile GPS unit for calibrating the GPS local oscillator used to acquire (e.g., downconvert) the GPS signals in the mobile unit of the present invention. The approach is to derive a stable frequency from the receiving circuitry of a communication receiver. Many communication signals, such as digital cellular and PCS signals have carrier frequencies stable to as good as 0.1 parts per million. The receivers for such signals provide, as part of their operation, a phase locking procedure applied to the receiver signal carrier so that such a carrier may be removed allowing the demodulation of the digital data imposed upon the carrier. The phase locking procedure normally produces as part of its process a stable local oscillator which can then be utilized to separately stabilize the local oscillators of a GPS receiver, thereby eliminating expensive components on this receiver.

The communication signal received by the communication receiver 640 may have one of a multiplicity of possible carrier frequencies, depending upon which channel it is tuned to. The first stage (converter 642) of the receiver downconverts the input signal to a single IF frequency, for example 140 MHz. This downconversion is controlled by the oscillator VCO1 643 which provides an oscillator signal input to the downconverter 642. The output of VCO1 is in turn controlled by the frequency synthesizer 644 which provides an input to oscillators VCO1 643 and VCO2 647. The mixer 646 forms a second stage RF to IF downconverter which is controlled by an input oscillator signal from oscillator 647. The following stage (Costas Loop Demodulator 648 and Temperature Compensated Voltage Controlled Oscillator (TCVCXO) 645) of the communication receiver is a phaselocking circuit whose purpose is to construct a local oscillator signal which is phaselocked to the incoming signal's carrier frequency. For a signal that is phase-shift keyed, a common circuit well known in the art to perform this circuit is the Costas Loop (e.g. see Gardner, Phaselock Techniques, 2nd Edition, John Wiley & Sons, 1979). In FIG. 6B the Costas Loop provides a frequency correction voltage to the reference frequency generator TCVCXO 645 which causes the output of TCVCXO 645 to be phase and frequency aligned with the carrier frequency of the IF signal.

The VCO output 645a (from TCVCXO 645) may then be supplied as a reference frequency to a frequency synthesizer 654 used with the GPS downconverter 652 of the GPS receiver portion 650. In this manner the frequency synthesizer produces inputs for local oscillators (VCO 653 and VCO4 655) for use in the GPS system that has the same frequency stability as that of the received communication signal. The oscillator 653 20 controls the first stage of the RF to IF downconversion, and the oscillator 655 controls the second stage of the RF to IF downconversion. The mixer 656 forms a second stage RF to IF downconverter which receives a first intermediate frequency from downconverter 652 and provides a second intermediate frequency to the digitizer circuits (shown together with the buffer and GPS processor in block 657).

Note that the above approach is applicable even though the frequency of the received communication signal may vary from one reception time to the next, if the signal is assigned to a different frequency channel.

Figure 6C:
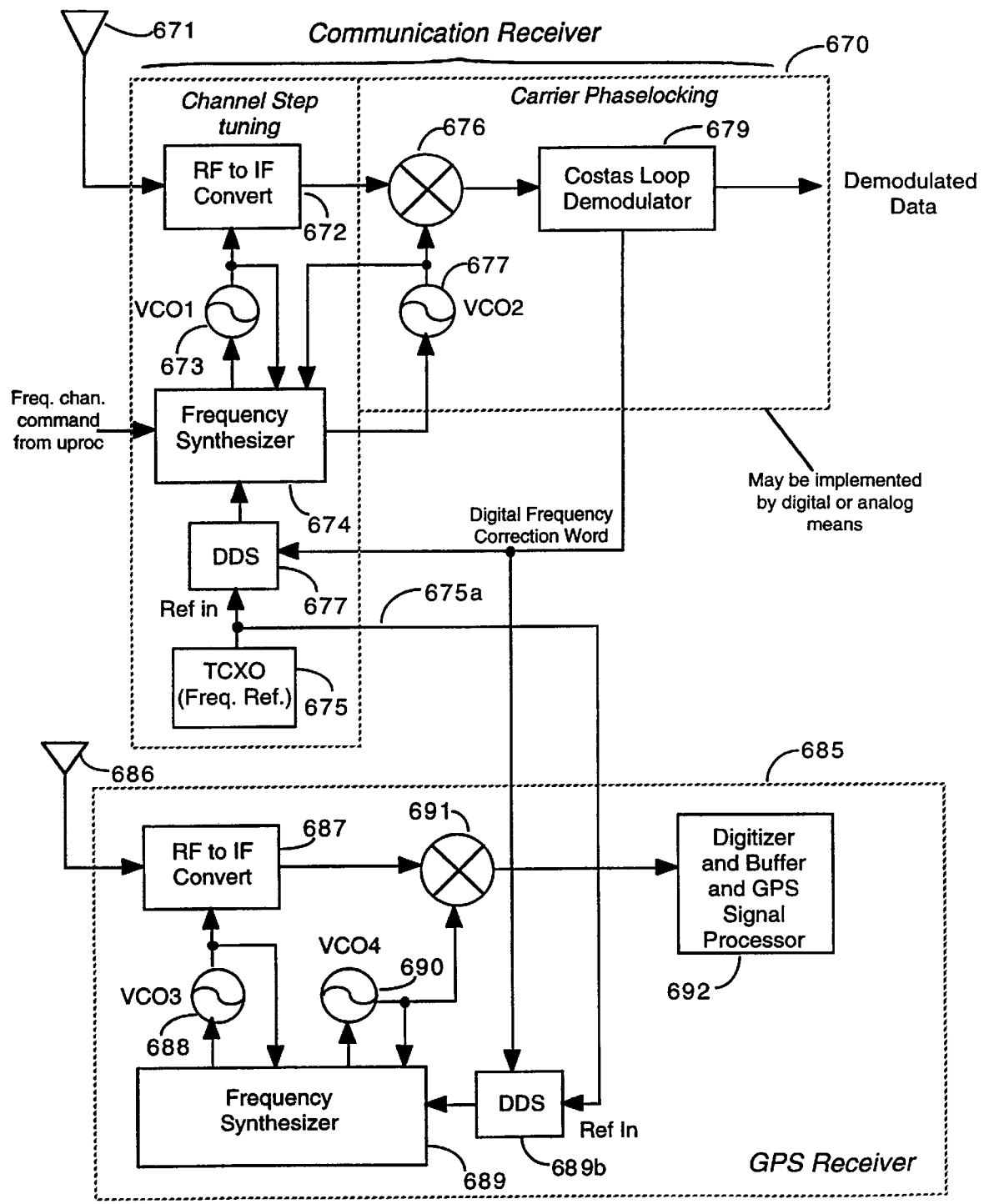

An alternative to the above approach is shown in FIG. 6C. Here a Direct Digital Synthesizer (DDS) 677 integrated circuit is provided with a digital tuning word from the Costas Loop 679, which is also implemented as a digital circuit. This tuning word can also then be supplied to the frequency synthesizer 689 that is part of the GPS receiver in order to stabilize its local oscillators. In this case this frequency synthesizer may also utilize a DDS 689b in order to allow precision adjustment of its frequency, an inherent feature of a DDS.

There are alternative hybrid combinations of the above approaches—e.g. a DDS in the communication receiver, but the DDS LO output being fed to the GPS system. The general approach is that a frequency locking or phaselocking circuit in the communication receiver produces either a tuning voltage or local oscillator signals which is fed to a frequency synthesis circuit on the GPS receiver in order to stabilize the local oscillators provided by this system.

It should be noted that the phaselocking circuits in receivers 640 and 670 may be alternatively implemented wholly or in part via digital signal processing means instead of analog means. In this case the input to these circuits may be digitized via an A/D converter and the circuit functions of these blocks may be constructed using hardwired or programmable (i.e. programmable DSP) digital signal processing elements.

FIG. 7 illustrates a particular sequence of power management according to one embodiment of the invention. It will be appreciated that there are numerous ways which are known in the art in order to reduce power. These include slowing down the clock provided to a synchronous, clocked component as well as completely shutting down power to a particular component or turning off certain circuits of a component but not others. It will be appreciated, for example, that phase lock loops and oscillator circuits require start up and stabilization times and thus a designer may decide not to power down completely (or at all) these components. The example shown in FIG. 7 begins in step 701 in which the various components of the system are initialized and placed in a reduced power state. Either periodically or after a predetermined period of time, the communication receiver in the modem 22 is returned to full power to determine whether commands are being sent from the basestation 10. This occurs in step 703. If a request is received in step 705 for location information from a base unit, the modem 22 alerts the power management circuit in step 707. At this point in time, the communication receiver in the modem 22 may be turned off for either a predetermined period of time or turned off to be turned on periodically again at a later time; this is shown as step 709. It will be appreciated that the communication receiver may maintained at a full power state rather than turning it off at this point in time. Then in step 711, the power management circuit returns the GPS receiver portion of the mobile unit to full power by powering up the converter 42 and the analog to digital converters 44; if the frequency oscillator 38 was also powered down, this component is powered up at this time and returned to full power and allowed some time to stabilize. Then in step 713, the GPS receiver, including components 38, 42 and 44 receive the GPS signal. This GPS signal is buffered in the memory 46 which has also been returned to full power when the GPS receiver was returned to full power in step 711. After collection of the snapshot information is completed, then the GPS receiver is returned to a reduced power state in step 717; this typically comprises reducing power for the converter 42 and 44 while keeping the memory 46 at full power. Then in step 719, the processing system is returned to full power; in one embodiment, this involves providing full power to the DSP chip 32; it will be appreciated however that if the DSP chip 32 is also providing power management functions as in the case of the embodiment shown in FIG. 1C, then the DSP chip 32a is typically returned to full power in step 707. In the embodiment shown in FIG. 1A where the microprocessor 26 performs power management function, the processing system, such as DSP chip 32 may be returned to full power at step 719. In step 721, the GPS signal is processed according to the method of the present invention, such as that shown in FIG. 3. Then, after completing the processing of the GPS signal, the processing system is placed in a reduced power state as shown in step 23 (unless the processing system is also controlling power management as noted above). Then, in step 725 the communication transmitter in the modem 22 is returned to full power in order to transmit in step 727 the processed GPS signal back to the basestation 10. After completing transmission of the processed GPS signal, such as pseudorange information or latitude and longitude information, the communication transmitter is returned to reduced power state in 729 and the power management system waits for a delay of a period of time such as predetermined period of time in step 731. Following this delay the communication receiver in the modem 22 is returned to full power in order to determine whether a request is being sent from a basestation.

Figure 8:
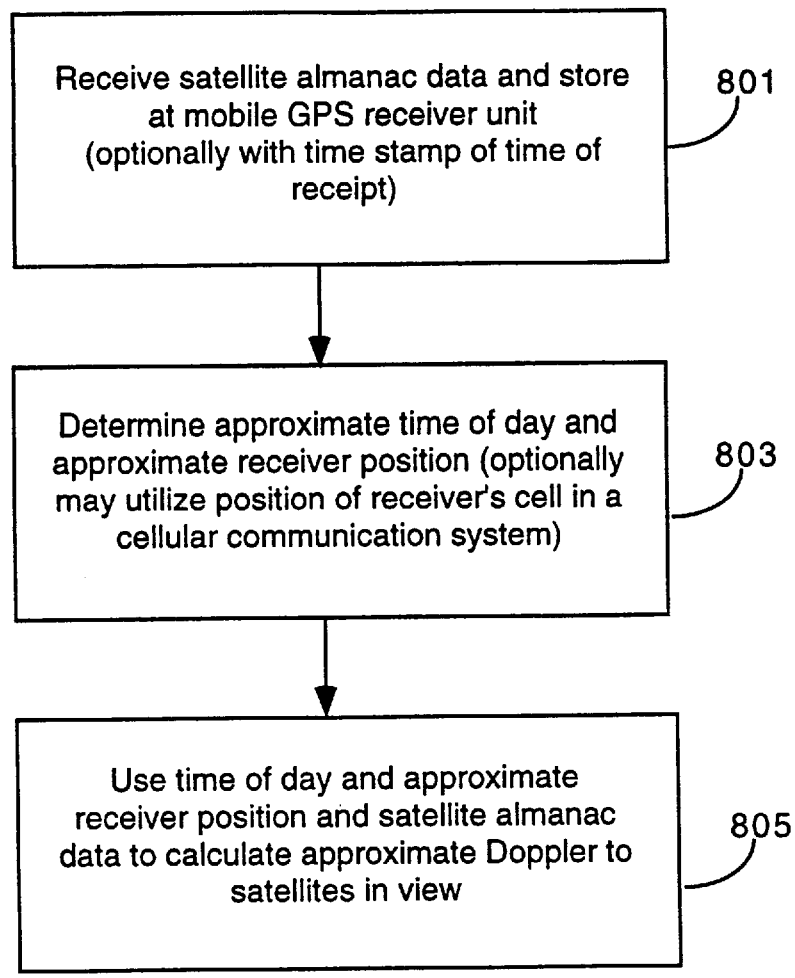
FIG. 8 shows a method for deriving Doppler information for satellites in view from satellite almanac data provided to a mobile unit.

FIG. 8 shows a method for deriving Doppler information for satellites in view from the satellite almanac data transmitted to a remote unit according to the present invention. The remote unit receives, in step 801, the satellite almanac data and stores this data in the remote unit (e.g., storing it in flash EEPROM). Optionally, the remote unit may time stamp the data with the current date and time in order to determine staleness of the almanac data later as described herein.

In step 803, the remote unit determines the approximate time of day and its approximate position. Using the approximate time and position with the satellite almanac data, the remote in step 805 determines the Doppler of all in view satellites. The remote unit, when receiving the position fix command from the basestation, may also receive an identification of satellites in view and use this identification to calculate Dopplers for only these satellites from the almanac data and from the approximate time and position determined in step 803. Although almanac data is provided in a specific form within the transmitted signal from the GPS satellites, it is not necessary that this information be supplied over the communication link in this form. For example, this data can be compressed by reducing the accuracy of the various transmitted quantities. Reduction in accuracy may reduce the Doppler accuracy, but such reduction may still be within the allowed error budget of the GPS receiver. Alternatively, another representation of the almanac data may be preferable, e.g. fitting the satellite position data to a set of curves, such as spherical harmonics. This approach may allow the GPS receiver to more easily compute Doppler from the supplied almanac data.

Approximate Doppler may be computed by computing the range from the remote to the satellites of interest at times separated by an appropriate interval (e.g. 1 second). This is done utilizing the supplied Almanac data and the approximate user position (e.g., based upon the fixed location of the cell site in a cellular phone system). The difference in these ranges is a range rate, which can be divided by the speed of light to yield a Doppler expressed in seconds per second (or another suitable set of units such as nanoseconds per second).

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should evident, however, that these methods are equally applicable to similar satellite positioning systems, and in, particular, the Russian Glonass system. The Glonass system primarily differs from GPS system in that the emissions from different satellites are differentiated from one another by utilizing slightly different carrier frequencies, rather than utilizing different pseudorandom codes. In this situation substantially all the circuitry and algorithms described previously are applicable with the exception that when processing a new satellite's emission a different exponential multiplier is used to preprocess the data. This operation may be combined with the Doppler correction operation of box 108 FIG. 3, without requiring any additional processing operations. Only one PN code is required in this situation, thus eliminating block 106. The term "GPS" used herein includes such alternative satellite positioning systems, including the Russian Glonass system.

Although FIGS. 1A, 1B and 1C illustrate a multiplicity of logic blocks that process digital signals (e.g. 46, 32, 34, 26, 30, 28 in FIG. 1A), it should be appreciated that several or all of the these blocks may be integrated together onto a single integrated circuit, while still maintaining the programmable nature of the DSP portion of such a circuit. Such an implementation may be important for very low power and cost sensitive applications.

It will be appreciated that the various aspects of the present invention, including the use of satellite almanac data at the remote unit to derive Doppler information and including the use of a precision carrier frequency signal to calibrate the output of a GPS local oscillator which is used to acquire GPS signals, may be used in GPS mobile units having architectures such as those described in U.S. patent application Ser. No. 08/652,833, filed May 23, 1996 by Norman F. Krasner, which application is hereby incorporated herein by reference.

It should also be appreciated that one or several of the operations of FIG. 3 may be performed by hardwired logic in order to increase the overall processing speed, while retaining the programmable nature of the DSP processor. For example, the Doppler correction capability of block 108 may be performed by dedicated hardware that may be placed between the digital snapshot memory 46 and the DSP IC 32. All other software functions of FIG. 3 may in such cases be performed by the DSP processor. Also, several DSPs may be used together in one remote unit to provide greater processing power. It will also be appreciated that it is possible to collect (sample) multiple sets of frames of GPS data signals and process each set as shown in FIG. 3 while accounting for the time between the collection of each set of frames.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of calibrating a local oscillator in a mobile GPS receiver, said method comprising:

receiving a precision carrier frequency signal from a source providing said precision carrier frequency signal;

automatically locking to said precision carrier frequency signal and providing a reference signal;

calibrating said local oscillator with said reference signal, said local oscillator being used to acquire GPS signals.

2. A method as in claim 1 wherein said receiving step comprises extracting said precision carrier frequency signal from a data signal containing satellite data information communicated over a communication link.

3. A method as in claim 2 wherein said satellite data information comprises a satellite almanac information for a plurality of satellites in view of said mobile GPS receiver.

4. A method as in claim 2 wherein said satellite data information comprises data representative of ephemeris for a satellite.

5. A method as in claim 2 wherein said communication link is selected from the group consisting of a two-way pager link or a cellular telephone link or personal communication system or specialized mobile radio or a wireless packet data system.

6. A method as in claim 2 wherein said communication link is a radio frequency communication medium.

7. A method as in claim 1 wherein said automatic frequency control logic comprises one of a phase lock loop or a frequency lock loop or a block phase estimator.

8. A method as in claim 7 wherein said reference signal provides a reference frequency which is compared to a frequency provided by said local oscillator to calibrate said local oscillator.

9. A method as in claim 1 wherein said mobile GPS receiver receives a data signal containing satellite data information which comprises a Doppler information of a satellite in view of said mobile GPS receiver.

10. A mobile GPS receiver comprising:

a first antenna for receiving GPS signals;

a downconverter coupled to said first antenna, said first antenna providing said GPS signals to said downconverter;

a local oscillator coupled to said downconverter, said local oscillator providing a first reference signal to said downconverter to convert said GPS signals from a first frequency to a second frequency;

a second antenna for receiving a precision carrier frequency signal from a source providing said precision carrier frequency signal;

an automatic frequency control (AFC) circuit coupled to said second antenna, said AFC circuit providing a second reference signal to said local oscillator to calibrate said first reference signal of said local oscillator, wherein said local oscillator is used to acquire said GPS signals.

11. A mobile GPS receiver as in claim 10 further comprising a comparator coupled to said AFC circuit and to said local oscillator, said comparator comparing said first reference signal and said second reference signal to adjust the frequency of said first reference signal from said local oscillator.

12. A mobile GPS receiver as in claim 11 wherein said AFC circuit comprises a phase lock loop coupled to a receiver which is coupled to said second antenna.

13. A mobile GPS receiver as in claim 10 further comprising a receiver coupled to said second antenna, said receiver for receiving said precision carrier frequency signal from said second antenna, wherein said receiver receives said precision carrier frequency signal with a data signal containing satellite data information communicated through said second antenna.

14. A mobile GPS receiver as in claim 13 wherein said satellite data information comprises a Doppler information of a satellite in view of said mobile GPS receiver.

15. A mobile GPS receiver as in claim 14 wherein said satellite data information comprises an identification of a plurality of satellites in view of said mobile GPS receiver and a corresponding plurality of Doppler information for each satellite of said plurality of satellites in view of said mobile GPS receiver.

16. A mobile GPS receiver as in claim 13 wherein said satellite data information comprises data representative of ephemeris for a satellite.

17. A method of using a basestation to calibrate a local oscillator in a mobile GPS receiver, said method comprising:

producing a first reference signal having a precision frequency;

modulating said first reference signal with a data signal to provide a precision carrier frequency signal;

transmitting said precision carrier frequency signal to said mobile GPS receiver, said precision carrier frequency signal being used to calibrate a local oscillator in said mobile GPS receiver, said local oscillator being used to acquire GPS signals.

18. A method as in claim 17 wherein said data signal contains satellite data information which comprises a satellite almanac information for a plurality of satellites in view of said mobile GPS receiver.

19. A method as in claim 17 wherein said data signal contains satellite data information which comprises data representative of ephemeris for a satellite.

20. A method as in claim 17 wherein said data signal contains satellite data information which comprises a Doppler information of a satellite in view of said mobile GPS receiver.

21. A basestation for providing a calibration signal for use in a mobile GPS receiver to calibrate a local oscillator in said mobile GPS receiver, said basestation comprising:

a first source for a first reference signal have a precision frequency;

a modulator coupled to said first source and to a second source of satellite data information said modulator providing a precision carrier frequency signal;

a transmitter coupled to said modulator, said transmitter for transmitting said precision carrier frequency signal to said mobile GPS receiver, said precision frequency signal being used to calibrate said local oscillator, said local oscillator being used to acquire said GPS signals.

22. A basestation as in claim 21 wherein said precision carrier frequency signal has a first frequency which is substantially different from a frequency of said GPS signals.

23. A basestation as in claim 21 wherein said satellite data information comprises data representative of ephemeris for a satellite in view of said mobile GPS receiver.

24. A basestation as in claim 21 further comprising a processor coupled to said transmitter, said processor instructing said transmitter to transmit to said mobile GPS receiver.

25. A basestation as in claim 24 wherein said processor determines a plurality of satellites in view of said mobile GPS receiver and obtains said satellite data information for each satellite of said plurality of satellites, and wherein said processor instructs said transmitter to transmit to said mobile GPS receiver an identification of said plurality of satellites and said satellite data information.

26. A basestation as in claim 25 wherein said satellite data information comprises Doppler information for said plurality of satellites.

27. A basestation as in claim 25 wherein said satellite data information comprises data representative of ephemeris for said plurality of satellites.

28. A basestation as in claim 21 wherein said satellite data information comprises a Doppler information of a satellite in view of said mobile GPS receiver.

29. A method of deriving a local oscillator signal in a mobile GPS receiver, said method comprising:

receiving a precision carrier frequency signal from a source providing said precision carrier frequency signal;

automatically locking to said precision carrier frequency signal and providing a reference signal;

using said reference signal to provide a local oscillator signal to acquire GPS signals.

30. A method as in claim 29 wherein said receiving step comprises extracting said precision carrier frequency signal from a data signal containing satellite data information communicated over a communication link.

31. A method as in claim 30 wherein said satellite data information comprises a satellite almanac information for a plurality of satellites in view of said mobile GPS receiver.

32. A method as in claim 30 wherein said satellite data information comprises data representative of ephemeris for a satellite.

33. A method as in claim 30 wherein said communication link is selected from the group consisting of a two-way pager link or a cellular telephone link or personal communication system or specialized mobile radio or a wireless packet data system.

34. A method as in claim 30 wherein said communication link is a radio frequency communication medium.

35. A method as in claim 29 wherein said step of using said reference signal comprises providing said reference signal to a frequency synthesizer and producing said local oscillator signal from said reference signal and said frequency synthesizer.

36. A method as in claim 29 further comprising downconverting GPS signals received through a GPS antenna, said downconverting step using said local oscillator signal to downconvert said GPS signals.

37. A method as in claim 29 wherein said step of using said reference signal comprises downconverting GPS signals received through a GPS antenna, said downconverting using said local oscillator signal to downconvert said GPS signals.

38. A mobile GPS receiver comprising:

a first antenna for receiving GPS signals;

a downconverter coupled to said first antenna, said first antenna providing said GPS signals to said downconverter, said downconverter having an input for receiving a local oscillator signal to convert said GPS signals from a first frequency to a second frequency;

a second antenna for receiving a precision carrier frequency signal from a source providing said precision carrier frequency signal;

an automatic frequency control (AFC) circuit coupled to said second antenna, said AFC circuit being coupled to said downconverter to provide said local oscillator signal which is used to acquire said GPS signals.

39. A mobile GPS receiver as in claim 38 further comprising a frequency synthesizer coupled to said AFC circuit and to said downconverter, said downconverter receiving said local oscillator through said frequency synthesizer.

* * * * *